(12) United States Patent
Swartz

(10) Patent No.: US 12,307,929 B2
(45) Date of Patent: May 20, 2025

(54) PORTABLE FOOD CONCESSION TRAILER

(71) Applicant: Hitch-Hiker Mfg., Inc., New Middleton, OH (US)

(72) Inventor: Jeffrey Mark Swartz, New Middletown, OH (US)

(73) Assignee: Hitch-Hiker Mfg., Inc., New Middleton, OH (US)

( * ) Notice: Subject to any disclaimer, the term of this patent is extended or adjusted under 35 U.S.C. 154(b) by 446 days.

(21) Appl. No.: 18/054,772

(22) Filed: Nov. 11, 2022

(65) Prior Publication Data

US 2024/0161661 A1    May 16, 2024

(51) Int. Cl.
| | |
|---|---|
| G09F 21/04 | (2006.01) |
| B60P 3/025 | (2006.01) |
| B60R 11/02 | (2006.01) |
| B60R 15/02 | (2006.01) |
| B62D 63/06 | (2006.01) |
| G09F 9/33 | (2006.01) |
| H05K 5/02 | (2006.01) |
| B60N 3/00 | (2006.01) |
| B60R 11/00 | (2006.01) |

(52) U.S. Cl.
CPC .............. *G09F 9/33* (2013.01); *B60P 3/0257* (2013.01); *B60R 11/0235* (2013.01); *B60R 15/02* (2013.01); *B62D 63/06* (2013.01); *G09F 21/048* (2013.01); *H05K 5/0217* (2013.01); *B60N 3/00* (2013.01); *B60R 2011/008* (2013.01)

(58) Field of Classification Search
CPC .............. G09F 13/044; G09F 13/0446; G09F 13/0463; G09F 21/042; G09F 21/04; G09F 9/33; G09F 21/048; B60P 3/0257; B60P 3/025; B60P 3/0255; B60P 7/02; B60P 1/26; B60S 9/10; B60R 2011/008; B60R 11/0235; B60R 15/02; B62D 63/06; B60N 3/00; H05K 5/0217
USPC ....... 40/590, 591, 571; 296/26.05, 26.04, 21
See application file for complete search history.

(56) References Cited

U.S. PATENT DOCUMENTS

| | | | |
|---|---|---|---|
| 4,152,854 A * | 5/1979 | Berry, Jr. ................ | B60Q 7/02 40/550 |
| 4,475,299 A * | 10/1984 | Nelson .................. | G09F 21/042 40/591 |
| 6,416,101 B1 | 7/2002 | Bartch | |
| 8,899,791 B2 | 12/2014 | Liu | |
| 9,282,641 B2 | 3/2016 | Liu | |
| 9,472,129 B2 | 10/2016 | Liu | |
| 12,252,054 B2 * | 3/2025 | Cohen ................ | B62D 33/0276 |

(Continued)

FOREIGN PATENT DOCUMENTS

| | | | |
|---|---|---|---|
| CN | 103072514 B | * | 9/2015 |
| CN | 206480328 U | * | 9/2017 |

(Continued)

*Primary Examiner* — Cassandra Davis
(74) *Attorney, Agent, or Firm* — Emerson, Thomson & Bennett, LLC

(57) ABSTRACT

A food concession vehicle may include a food processing area, two LED display screens and an adjustment mechanism that can move the LED display screens between a first position where the two screens are coplanar and too high to pass under a bridge and a second position where the two screens are able to pass under a bridge. When in the first position, the two screens may be able to provide a single continuous image.

20 Claims, 21 Drawing Sheets

(56) References Cited

U.S. PATENT DOCUMENTS

| | | | | |
|---|---|---|---|---|
| 2006/0209547 A1* | 9/2006 | Biondo | ................... | G09F 9/33 |
| | | | | 362/388 |
| 2017/0232880 A1* | 8/2017 | Peterson | .............. | B60P 3/0255 |
| | | | | 296/21 |
| 2021/0276476 A1* | 9/2021 | Borden | ................. | B62D 39/00 |
| 2023/0060734 A1* | 3/2023 | Boswell | .................... | B60P 3/03 |

FOREIGN PATENT DOCUMENTS

| | | | | | |
|---|---|---|---|---|---|
| DE | 19508374 | A1 | * | 9/1996 | ............ A47B 85/00 |
| KR | 20160056053 | A | * | 5/2016 | |
| KR | 101657064 | B1 | * | 6/2016 | |
| KR | 102080303 | B1 | * | 2/2020 | |

\* cited by examiner

PORTABLE FOOD CONCESSION TRAILER

I. BACKGROUND

A. Field of the Invention

This invention generally relates to apparatuses and methods concerning food concession vehicles and LED display screens.

B. Description of Related Art

Food concession vehicles are well known. Portable food concession trailers, for example, have for many years been transported to various events such as fairs, sports games, business locations during lunch and the like. At the completion of one event, the food concession vehicle can easily be transported to another event and/or location. The operators of food concession vehicles typically wish to advertise their products to visitors of the vehicle. As a result, food concession vehicles often include various types of advertising surfaces. In general, advertising surfaces are more effective when they incorporate animated images. Thus, in recent years LED display screens are often used on food concession vehicles.

Advertising surfaces are also more effective when they are large and thus easier to see both when close-up and when far away. The size of advertising surfaces on food concession vehicles are limited, however, because of the requirement that vehicles must be able to pass under bridges. FIG. 1 shows a typical bridge 10 having a height or clearance 12 above the road surface 14. While the bridge height/clearance 12 requirement may vary somewhat from state to state, the "safe side" general rule is 13 feet, 6 inches (13.5 feet). It is desirable, however, for food concession vehicles to have advertising surfaces that extend above 13.5 feet from the ground surface when the vehicle is onsite. As a result, it is known to provide food concession vehicles with advertising surfaces that can be raised when the vehicle is onsite and lowered so the vehicle can travel to the next site and pass under bridges.

Known food concession vehicles with advertising surfaces that can be raised and lowered have problems, however. FIG. 2 shows a known food concession trailer 20 having service stations 21 to serve customers. Above the service stations 21 is an advertising surface 22 that has an upper portion 23 and a lower portion 24, separated by a division line 28. The upper portion 23 may be movable relative to the lower portion 24, such as by folding upper portion 23 downward with respect to lower portion 24 at the division line 28, to reduce the maximum height of the advertising surface 22 for travel. Attached to the upper portion 23 is a first LED display screen 25 and attached to the lower portion 24 is a second LED display screen 26. There is a gap 27 between the LED display screens 25, 26. This gap 27 is typically 6-12 inches and prevents the LED display screens 25, 26 from providing a single continuous image. Instead, the image provided on LED display screen 25 is distinct from the image provided on LED display screen 26.

What is needed is a food concession vehicle with advertising surfaces that can be raised and lowered and with LED display screens that provide a continuous image.

II. SUMMARY

According to some embodiments of this invention, a portable food concession trailer may include: a trailer frame; at least two ground engaging wheels rotatably mounted to the trailer frame and selectively operable to carry the portable food concession trailer along an associated ground surface; and a food processing area supported to the trailer frame. The food processing area may include: 1) at least one sink including at least one basin and at least one water supply implement; and 2) at least two distinct food processing components. A first LED display screen may be: 1) supported to the trailer frame; and 2) have a planar surface area of at least 9 square feet and a second LED display screen may be: 1) supported to the trailer frame; and 2) have a planar surface area of at least 9 square feet. A lighting control system may be: 1) supported to the trailer frame; and 2) operatively connected to the first and second LED display screens. An adjustment mechanism may be: 1) supported to the trailer frame; and 2) operatively connected to at least one of the first and second LED display screens. The adjustment mechanism may be selectively operable to move the first LED display screen with respect to the second LED display screen between a first position and a second position. When in the first position: 1) the first LED display screen may be coplanar with the second LED display screen; 2) the first and second LED display screens may be at an angle A with respect to the associated ground surface; 3) angle A may be one of: an acute angle of at least 45 degrees and a right angle; 4) an outer edge of the first LED display screen may separated from an outer edge of the second LED display screen by no more than distance D1 and D1 is 1.0 inch; 5) the lighting control system may be selectively operable to create a single continuous image simultaneously using the first and second LED display screens; and 6) at least one of the first and second LED display screens may have a maximum height above the associated ground surface that is at least 13.5 feet. When in the second position: 1) the first LED display screen may be at an angle B with respect to the second LED display screen; 2) angle B may be between 0 degrees and 75 degrees; and 3) both the first and second LED display screens may have a maximum height above the associated ground surface that is less than 13.5 feet so that the portable food concession trailer can pass under bridges on public roads.

According to some embodiments of this invention, a food concession vehicle may include: a vehicle frame; at least two ground engaging wheels rotatably mounted to the vehicle frame and selectively operable to carry the portable food concession vehicle along an associated ground surface; and a food processing area supported to the vehicle frame and including at least one food processing component. A first LED display screen may: 1) be supported to the vehicle frame; and 2) have a planar surface area of at least 9 square feet. A second LED display screen may: 1) be supported to the vehicle frame; and 2) have a planar surface area of at least 9 square feet. A lighting control system may be: 1) supported to the vehicle frame; and 2) operatively connected to the first and second LED display screens. An adjustment mechanism may be: 1) supported to the vehicle frame; and 2) operatively connected to at least one of the first and second LED display screens. The adjustment mechanism may be selectively operable to move the first LED display screen with respect to the second LED display screen between a first position and a second position. When in the first position: 1) the first LED display screen may be coplanar with the second LED display screen; 2) the first and second LED display screens may be at an angle A with respect to the associated ground surface; 3) angle A may be one of: an acute angle of at least 45 degrees and a right angle; 4) an outer edge of the first LED display screen may be separated from an outer edge of the second LED display screen by no more than distance D1 and D1 is 1.0 inch; 5) the lighting control system may be selectively operable to create a single continuous image simultaneously using the first and second LED display screens; and 6) at least one of the first and second LED display screens may have a maximum height above the associated ground surface that is at least 13.5 feet. When in the second position: 1) the first LED display screen may be at an angle B with respect to the second LED display screen; 2) angle B may be between 0 degrees and 75 degrees; and 3) both the first and second LED display screens may have a maximum height above the associated ground surface that is less than 13.5 feet so that the food concession vehicle can pass under bridges on public roads.

According to some embodiments of this invention, a portable food concession trailer method may comprise the steps of: A) providing a portable food concession trailer including: 1) a trailer frame; 2) at least two ground engaging wheels rotatably mounted to the trailer frame; 3) a food processing area supported to the trailer frame and including: (a) at least one sink including a basin and a water supply implement; and (b) at least two distinct food processing components; 4) a first LED display screen: (a) supported to the trailer frame; and (b) having a planar surface area of at least 9 square feet; 5) a second LED display screen: (a) supported to the trailer frame; and (b) having a planar surface area of at least 9 square feet; 6) a lighting control system: (a) supported to the trailer frame; and (b) operatively connected to the first and second LED display screens; 7) an adjustment mechanism: (a) supported to the trailer frame; and (b) operatively connected to at least one of the first and second LED display screens; B) providing the at least two ground engaging wheels to be selectively operable to carry the portable food concession trailer along an associated ground surface; C) providing the adjustment mechanism to be selectively operable to move the first LED display screen with respect to the second LED display screen between a first position and a second position; D) providing when in the first position: 1) the first LED display screen is coplanar with the second LED display screen; 2) the first and second LED display screens are at an angle A with respect to the associated ground surface; 3) angle A is one of: an acute angle of at least 45 degrees and a right angle; 4) an outer edge of the first LED display screen is separated from an outer edge of the second LED display screen by no more than distance D1 and D1 is 1.0 inch; 5) the lighting control system is selectively operable to create a single continuous image simultaneously using the first and second LED display screens; and 6) at least one of the first and second LED display screens has a maximum height above the associated ground surface that is at least 13.5 feet; and E) providing when in the second position: 1) the first LED display screen is at an angle B with respect to the second LED display screen; 2) angle B is between 0 degrees and 75 degrees; and 3) both the first and second LED display screens have a maximum height above the associated ground surface that is less than 13.5 feet so that the portable food concession vehicle can pass under bridges on public roads.

III. BRIEF DESCRIPTION OF THE DRAWINGS

The invention may take physical form in certain parts and arrangement of parts, embodiments of which will be described in detail in this specification and illustrated in the accompanying drawings which form a part hereof and wherein:

FIG. 11b is a second side view of the LED panel similar to what is shown in FIG. 11a but with a door opened to reveal components hidden in FIG. 11a.

IV. DETAILED DESCRIPTION

Figure 1:
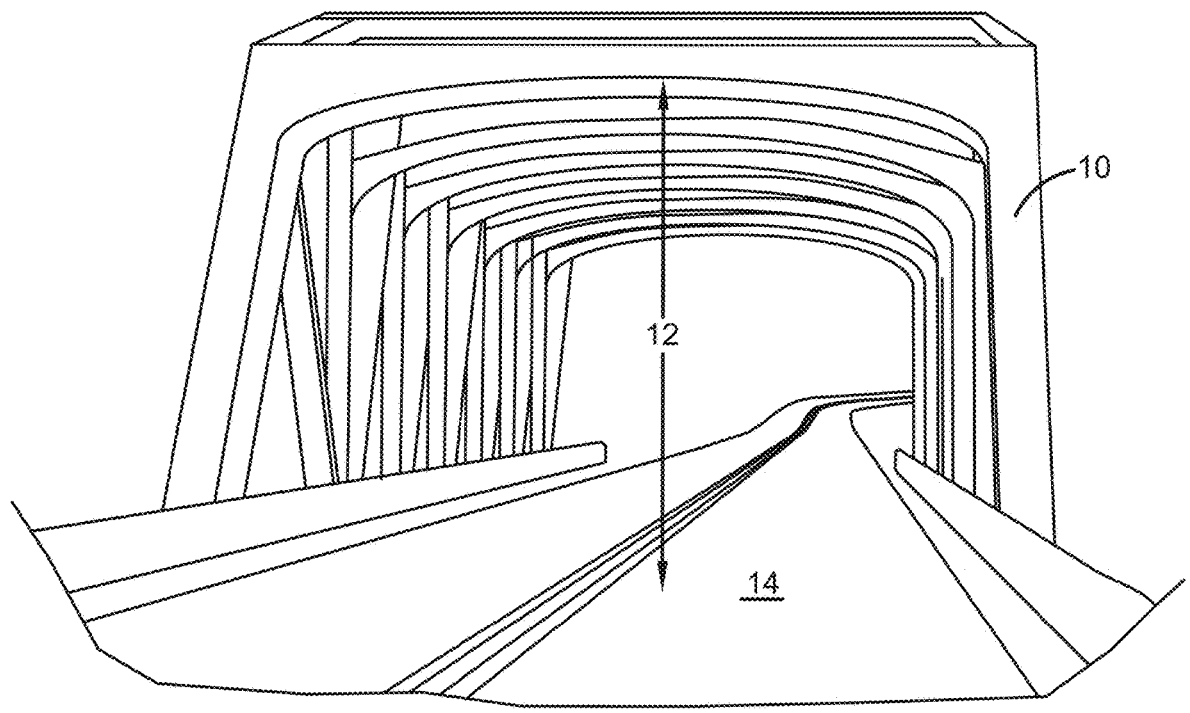
FIG. 1 is a perspective view of a bridge having a height or clearance above the road surface.
Figure 2:
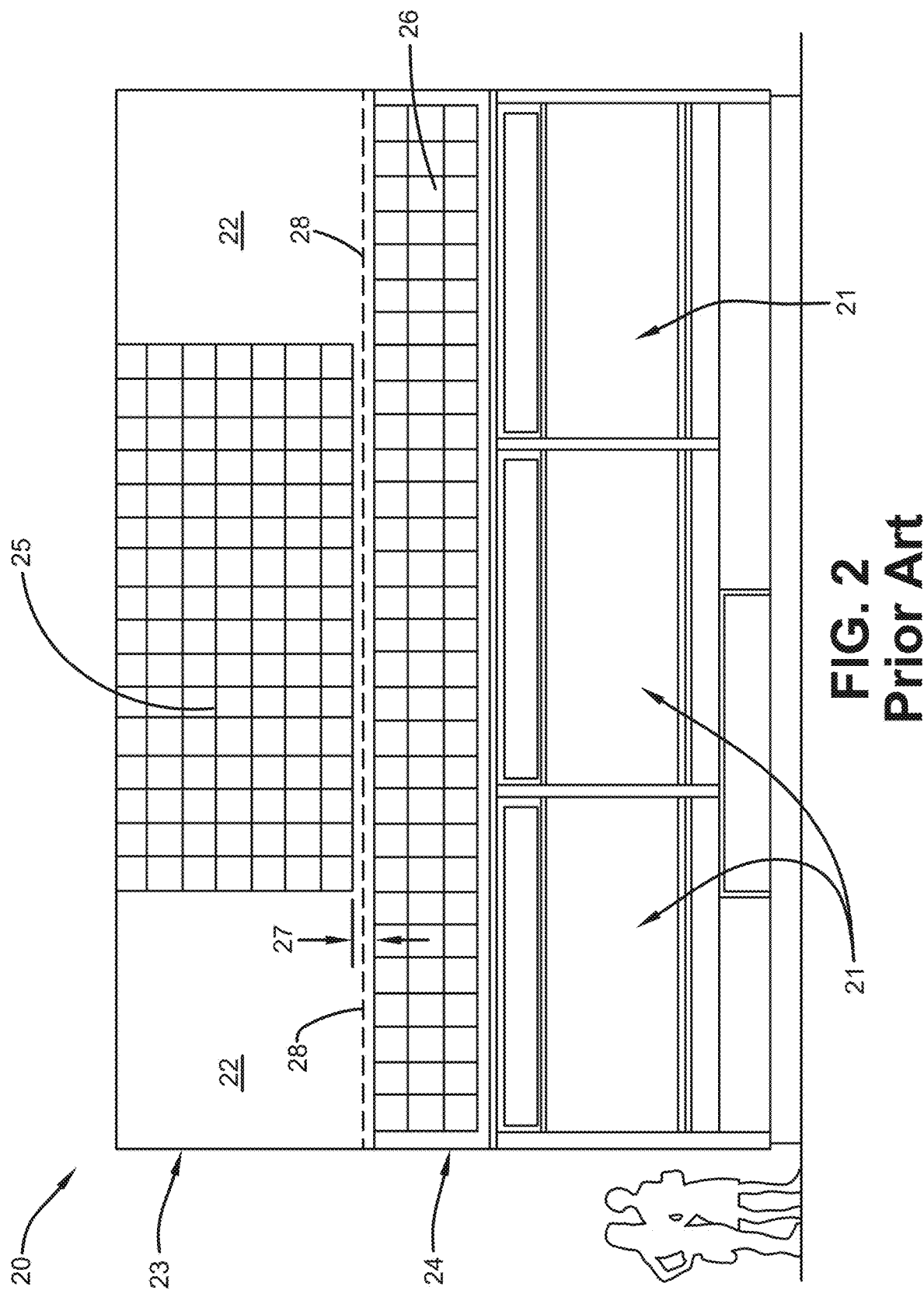
FIG. 2 is a front view of a known portable food concession trailer.

Referring now to the drawings wherein the showings are for purposes of illustrating embodiments of the invention only and not for purposes of limiting the same, and wherein like reference numerals are understood to refer to like components, FIGS. 3-13 show a food concession trailer 300 according to some embodiments of this invention. It should be noted that while the shown food concession trailer is transported by a truck (not shown) from place to place, this invention will work well with any food concession vehicle chosen with the sound judgement of a person of skill in the art, such as, but not limited to, a food truck. The food concession trailer 300 may have a trailer frame 302 and at least two ground engaging wheels 304 rotatably mounted with respect to the frame 302 and selectively operable to carry the portable food concession trailer 300 along an associated ground surface 306. The food concession trailer 300 may have a food processing area (more accurately, a food processing "volume" as well known to a person of skill in the art) 307 supported to the frame 302 that may include any food preparation and service components required. With reference now especially to FIGS. 5-8, in some embodiments, the food processing area 307 may include at least two distinct food processing components 308 supported to the frame 302. It should be understood that the particular food processing components used will vary depending on the food products provided. This is well known to those in the food processing industry. For the non-limiting embodiments shown, the food processing components 308 include one or more deep fryers 308a, one or more food heaters 308b or one or more ovens 308c and/or one or more counters 308d. In some embodiments, the food processing area 307 may include at least one sink 310. A sink 310 may include at least one basin 310a and at least one water supply implement 310b. The food concession trailer 300 may include one or more service stations 312, three shown, to serve customers as is well known. In some embodiments, to insure top quality, the equipment in the food processing area 307 is NSF certified.

With reference now to FIGS. 3-4, 9-11 and 13, the portable food concession trailer 300 may have an advertising surface 316 supported to the frame 302. In some embodiments, shown, the advertising surface 316 is positioned above the food processing area 307. The advertising surface 316 may have an upper portion 318 and a lower portion 320, separated by a division line 322. The upper portion 318 may be movable relative to the lower portion 320 to reduce the maximum height of the advertising surface 316 for travel as will be discussed further below. Attached to the upper portion 318 may be a first LED display screen 324 and attached to the lower portion 320 may be a second LED display screen 326. The designs and sizes of the LED display screens 324, 326 can be any chosen with sound engineering judgement. Each LED display screen 324, 326 may be supported to a corresponding screen frame 325, 327. For the embodiments shown, each LED display screen 324, 326 may have planar display surfaces 328, 330 with surface areas of at least 9 square feet. In other embodiments, the planar display surfaces 328, 330 have surface areas of at least 15 square feet. In yet other embodiments, the planar display surfaces 328, 330 have surface areas of at least 20 square feet. It should be noted that LED display screens with smaller and larger surface areas are contemplated with this invention. The LED display screens 324, 326 may, in some embodiments, be formed from multiple LED panels 332, see FIGS. 10-11. Each LED panel 332 may have a first side 334 that defines the corresponding LED display screen and a second side 336 that includes a panel controller 338 for controlling the LED display of that LED panel 332. The second side 336 of each LED panel 332 may be supported to the corresponding screen frame 325, 327.

Figure 11B:
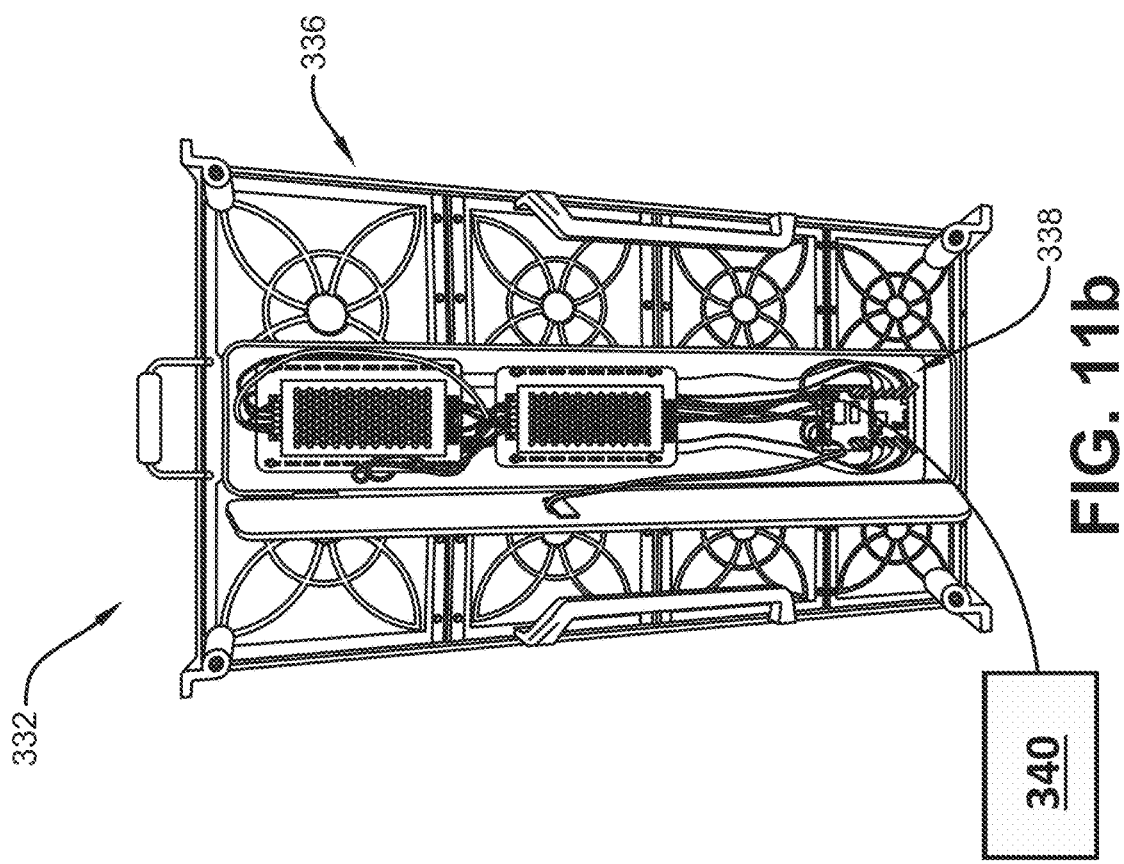
Figure 11A:
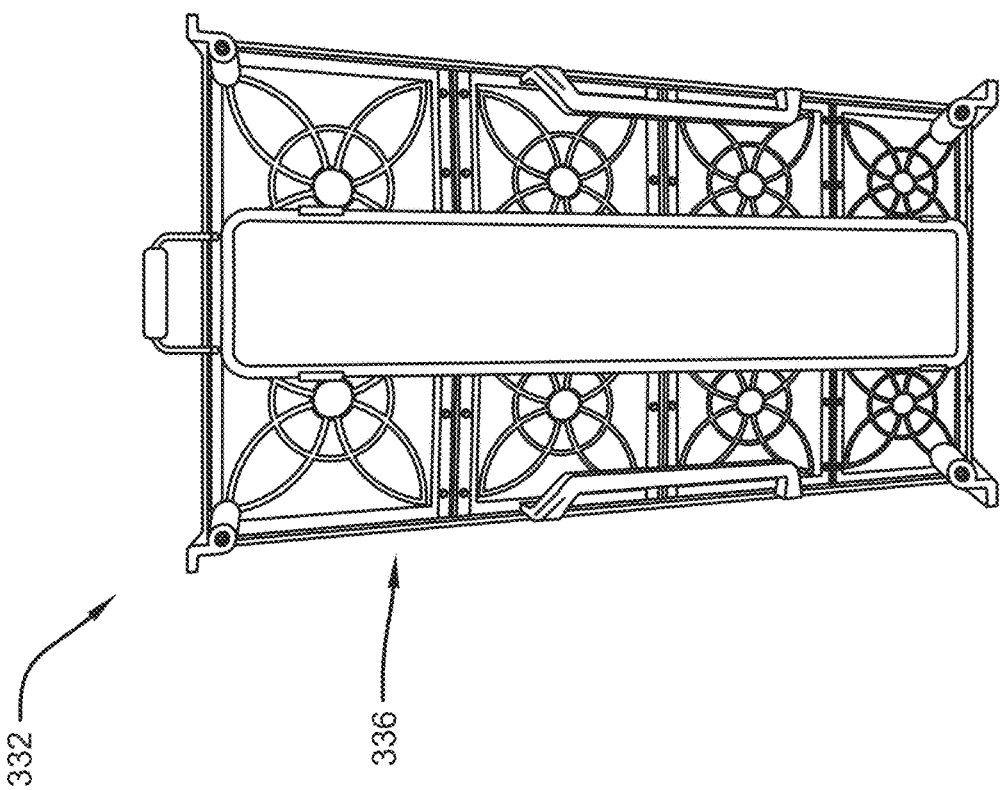
FIG. 11a is a second side view of the LED panel shown in FIG. 10 according to some embodiments of this invention.
Figure 12:
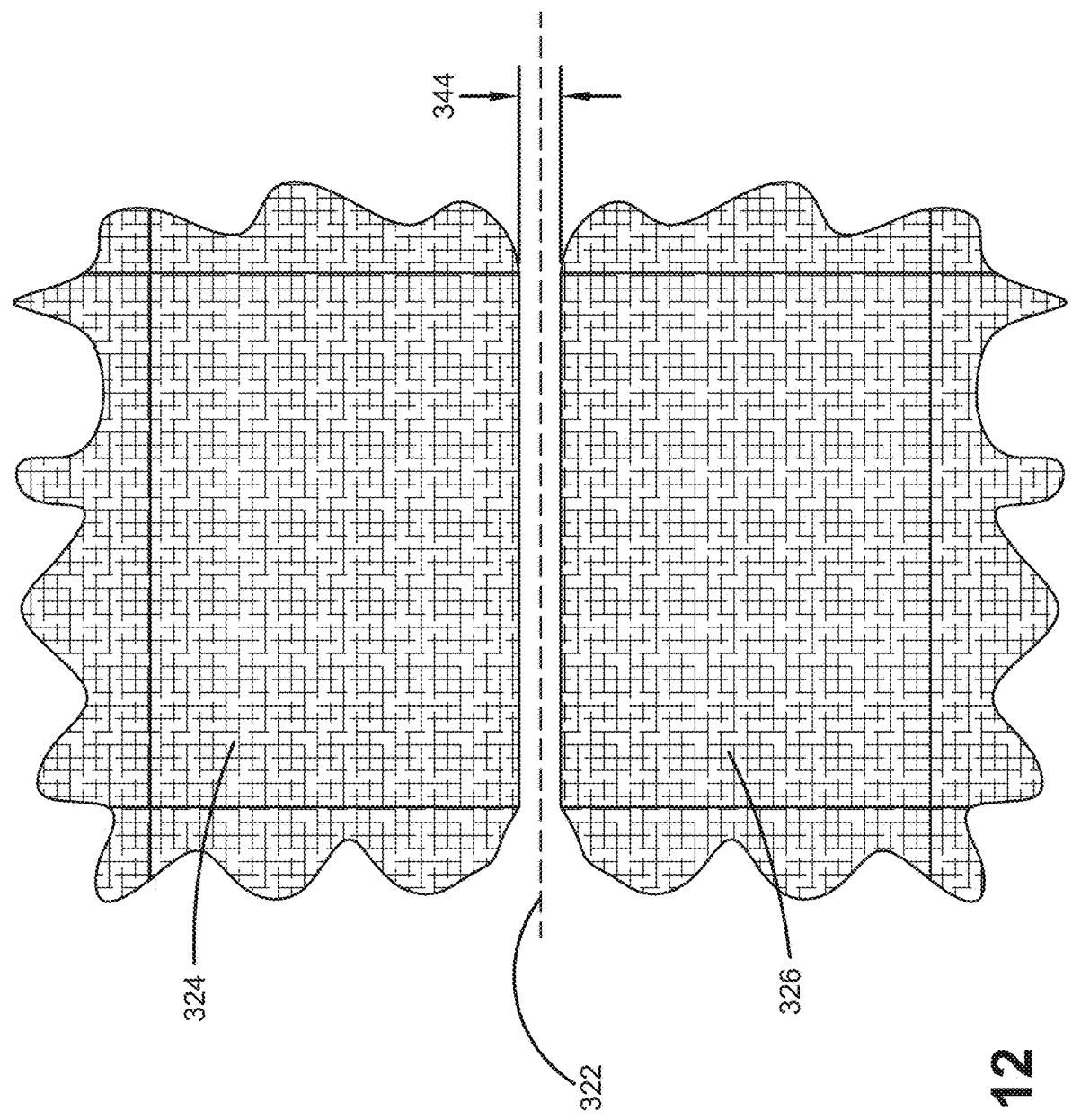
FIG. 12 is a close-up view of the LED screens shown in FIG. 9 with the small gap between LED screens visible.
Figure 13:
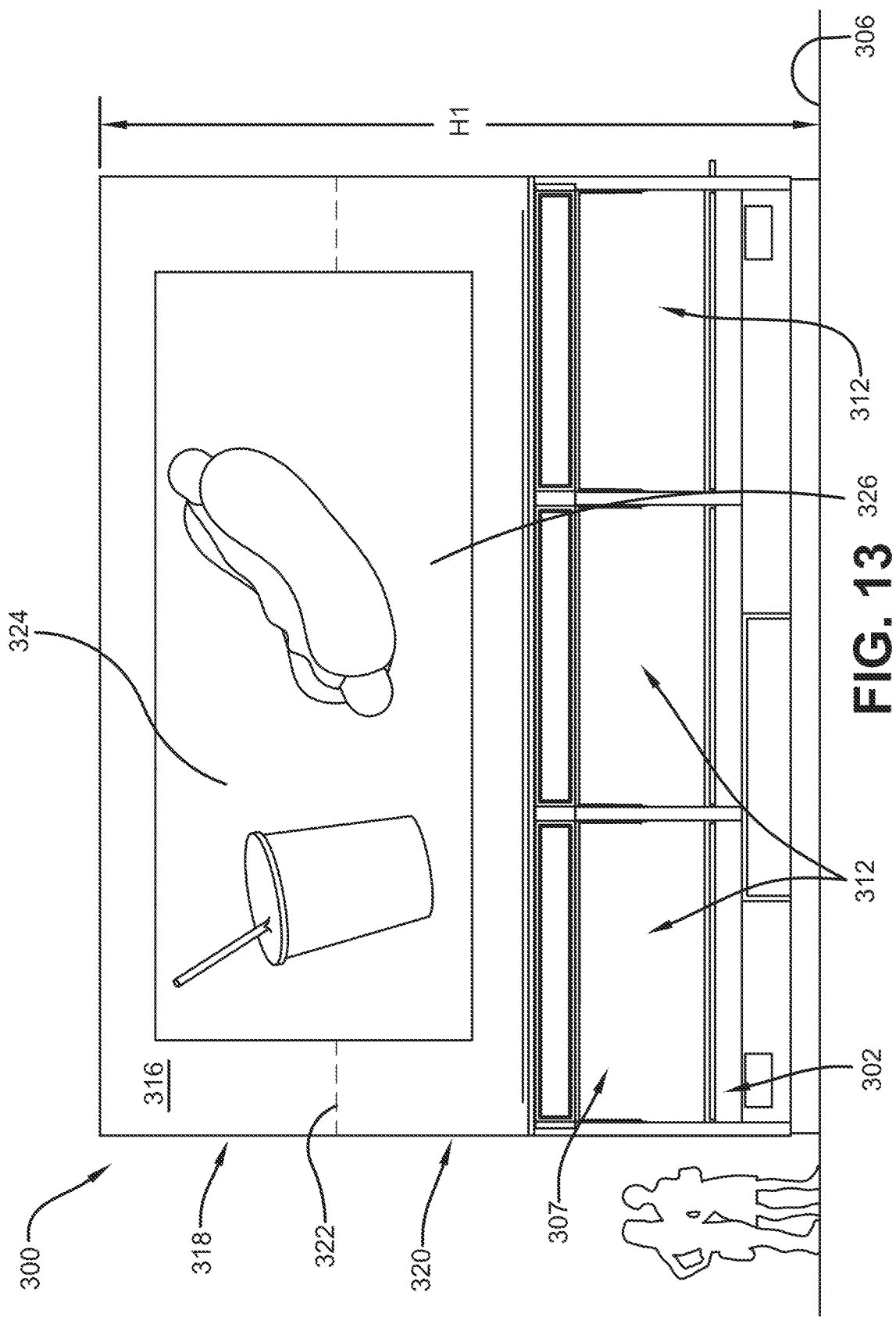
FIG. 13 is a front view of the portable food concession trailer shown in FIG. 9 but with a single continuous image shown simultaneously on both the first and second LED display screens.

With reference now to FIGS. 9-13, a lighting control system 340 of any type chosen with sound engineering judgement may be supported to the trailer frame 302 and may be operatively connected to the first and second LED display screens 324, 326, such as via the panel controllers 338. The lighting control system 340 can be operated in a known manner to provide the desired display on the LED display screens 324, 326. Because of improvements provided by this invention, the gap 344 between the LED display screens 324, 326 is not visible in FIG. 9 or 13 but is only visible in a close-up view, such as the close-up view shown in FIG. 12. Gap 344 is no more than distance D1 and in some embodiments D1 is 1.0 inch—this small of a gap is believed to be a first in the industry. In some embodiments, D1 is 0.5 inches. In some embodiments D1 is 0.2 inches. In yet other embodiments, D1 is 0.1 inches. What is especially significant about this small gap D1 is that the LED screens 324, 326 can provide a continuous image—thus, from the observers view the two LED screens 324, 326 provide a single image—an example of which is shown in FIG. 13.

Figure 14:
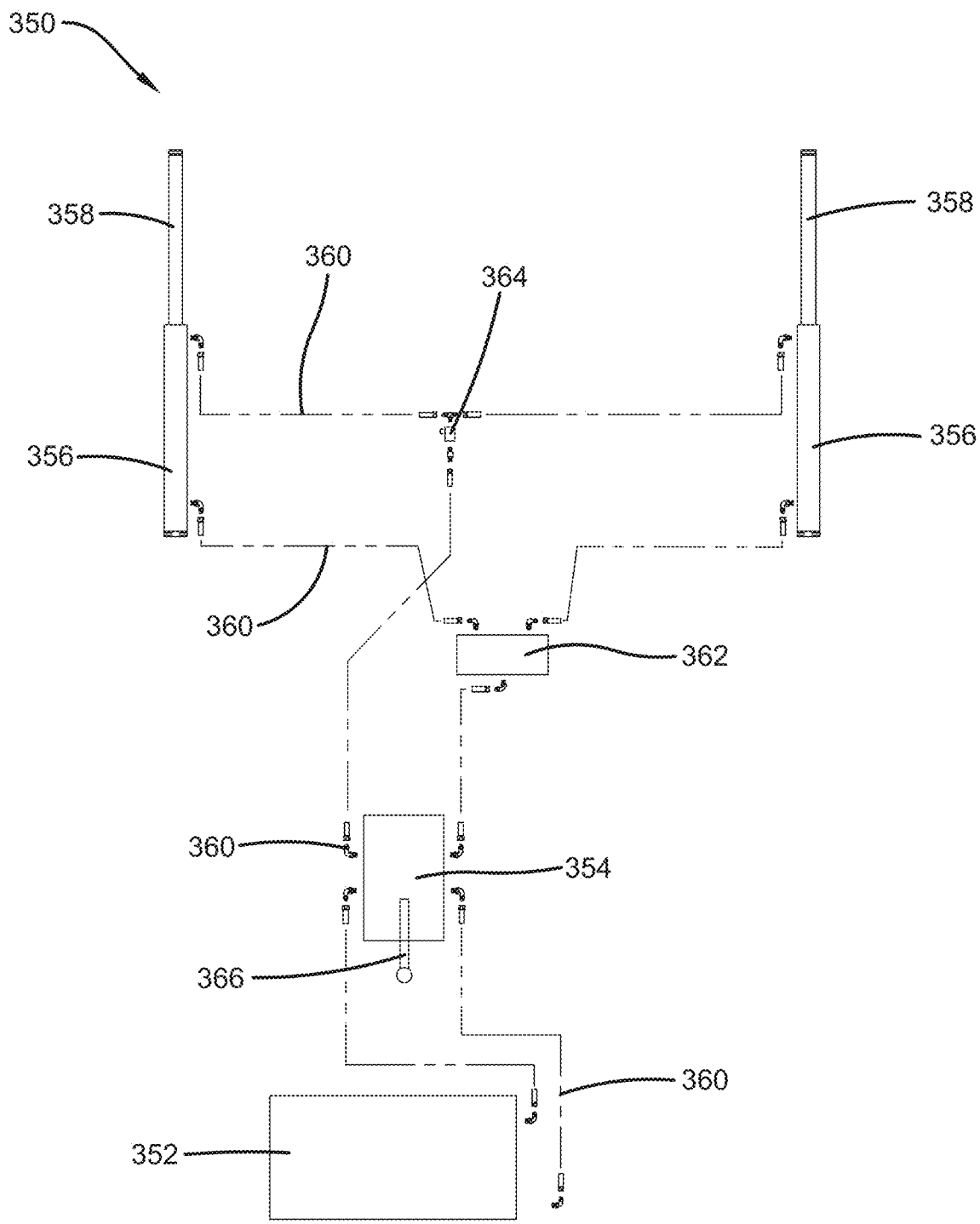
FIG. 14 is a schematic diagram of an adjustment mechanism according to some embodiments of this invention.

With reference now to FIGS. 3-4, 9, 13-15 and 17, the portable food concession trailer 300 may have an adjustment system 350, only visible in FIG. 14, supported to the frame 302 and operatively connected to at least one of the first and second LED display screens 324, 326. The adjustment system 350 may be of any type and size chosen with sound engineering judgement to move the first LED display screen 324 with respect to the second LED display screen 326 between a first position (shown in FIGS. 9, 13 and 15) and a second position (shown in FIGS. 3-4 and 17). With reference to FIG. 14, in some embodiments, the adjustment system 350 is a hydraulic system including a pump station 352, an adjustment system controller 354, at least one hydraulic cylinder 356 (two shown) having a corresponding piston rod 358 and required piping/hoses and fittings 360. If more than one hydraulic cylinder 356 is used, as with the embodiment shown, a flow divider 362 and a flow control valve 364 may be used to properly supply hydraulic fluid to the hydraulic cylinders 356, 356. In other embodiments, not shown, the adjustment system 350 may be a pneumatic system, an electric driven system, or any other appropriate system.

Figure 3:
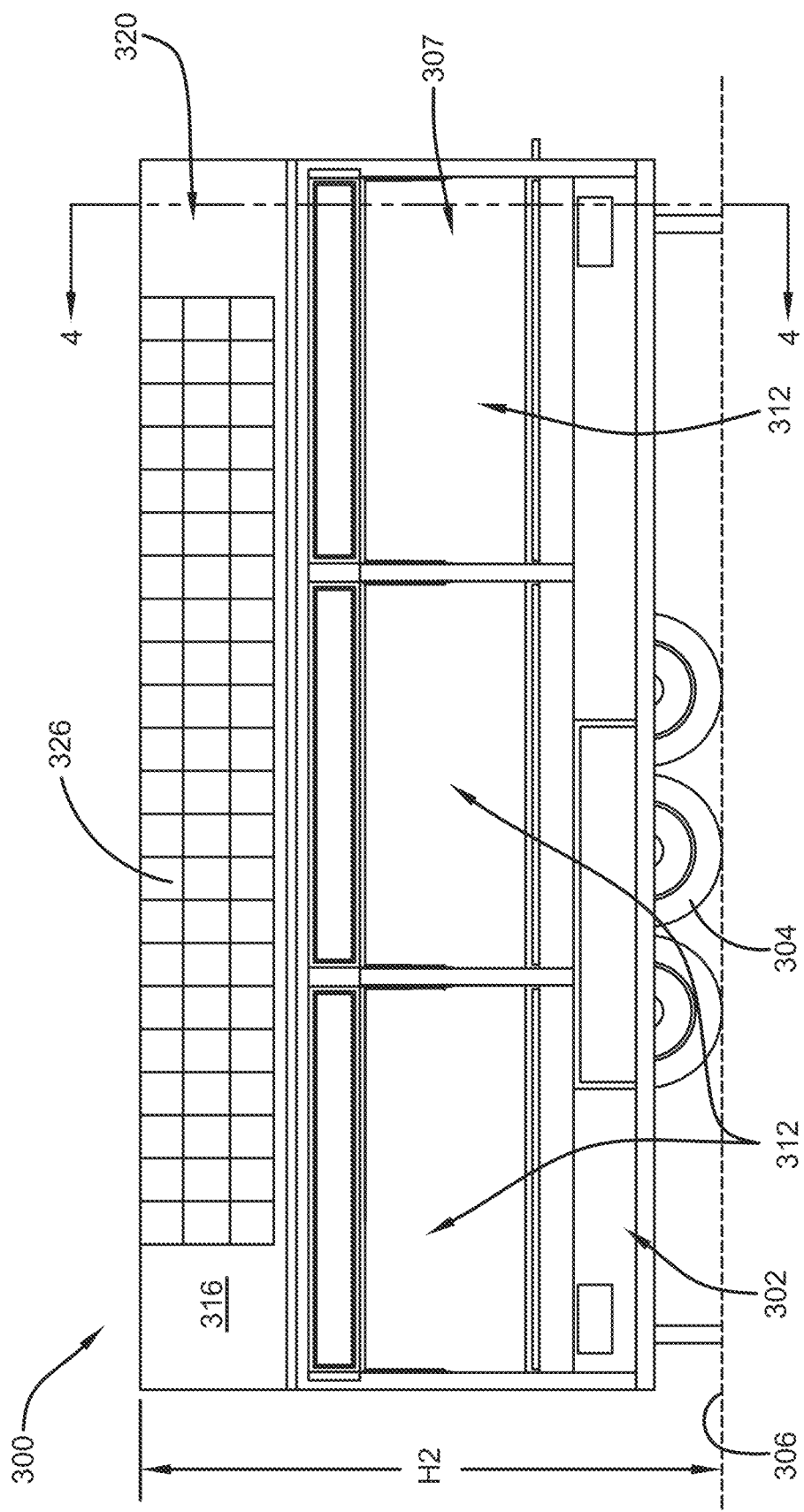
FIG. 3 is a front view of a portable food concession trailer according to some embodiments of this invention, shown in the second position.
Figure 18:
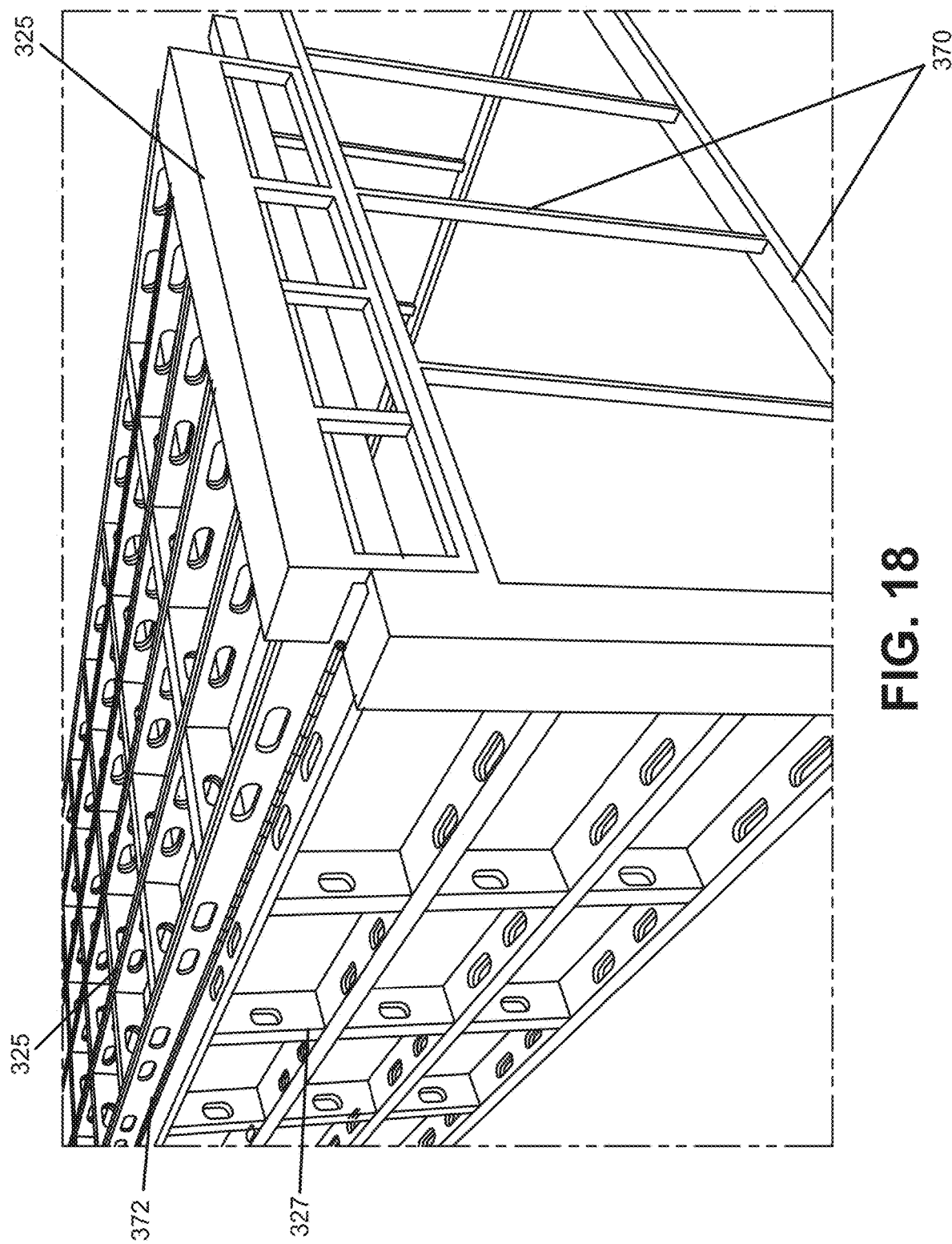
FIG. 18 is a perspective end view of the screen frames in the second position with the LED screens removed for clarity.
Figure 19:
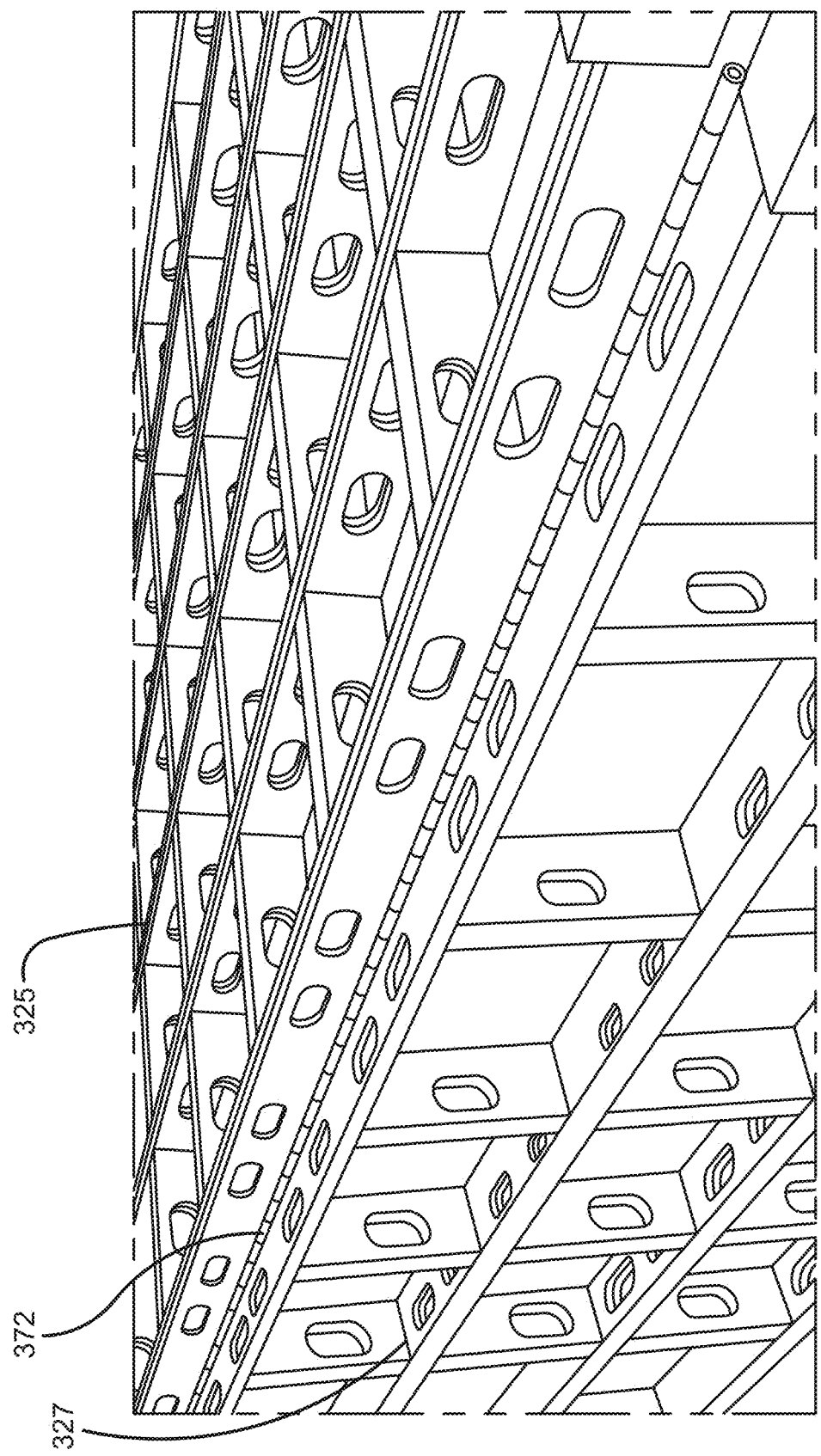
FIG. 19 is a close-up view of a portion of the screen frames shown in FIG. 18.

In some embodiments, shown in FIGS. 3 and 18, the food concession trailer 300 may include support structure 370 that is supported to the frame 302. The support structure 370 may be connected to the screen frame 327 and thus assist in supporting the LED display screen 326 to the frame 302. In some embodiments, shown, the screen frame 325, and thus LED display screen 324, may rest on the support structure 370 when the LED display screens 324, 326 are in the second position. FIGS. 18 and 19 show the screen frames 325, 327 in the second position but with the LED display screens removed for clarity. With reference also to FIG. 14, in some embodiments, the screen frames 325, 327 are interconnected using one or more hinges 372 and the distal end(s) of the piston rod(s) 358 may be operatively connected to the upper portion 318 of the advertising surface 316, such as being operatively connected to the screen frame 325. In this case, the first LED display screen 324 may be pivoted with respect to the second LED display screen 326 between the first and second positions.

Figure 9:
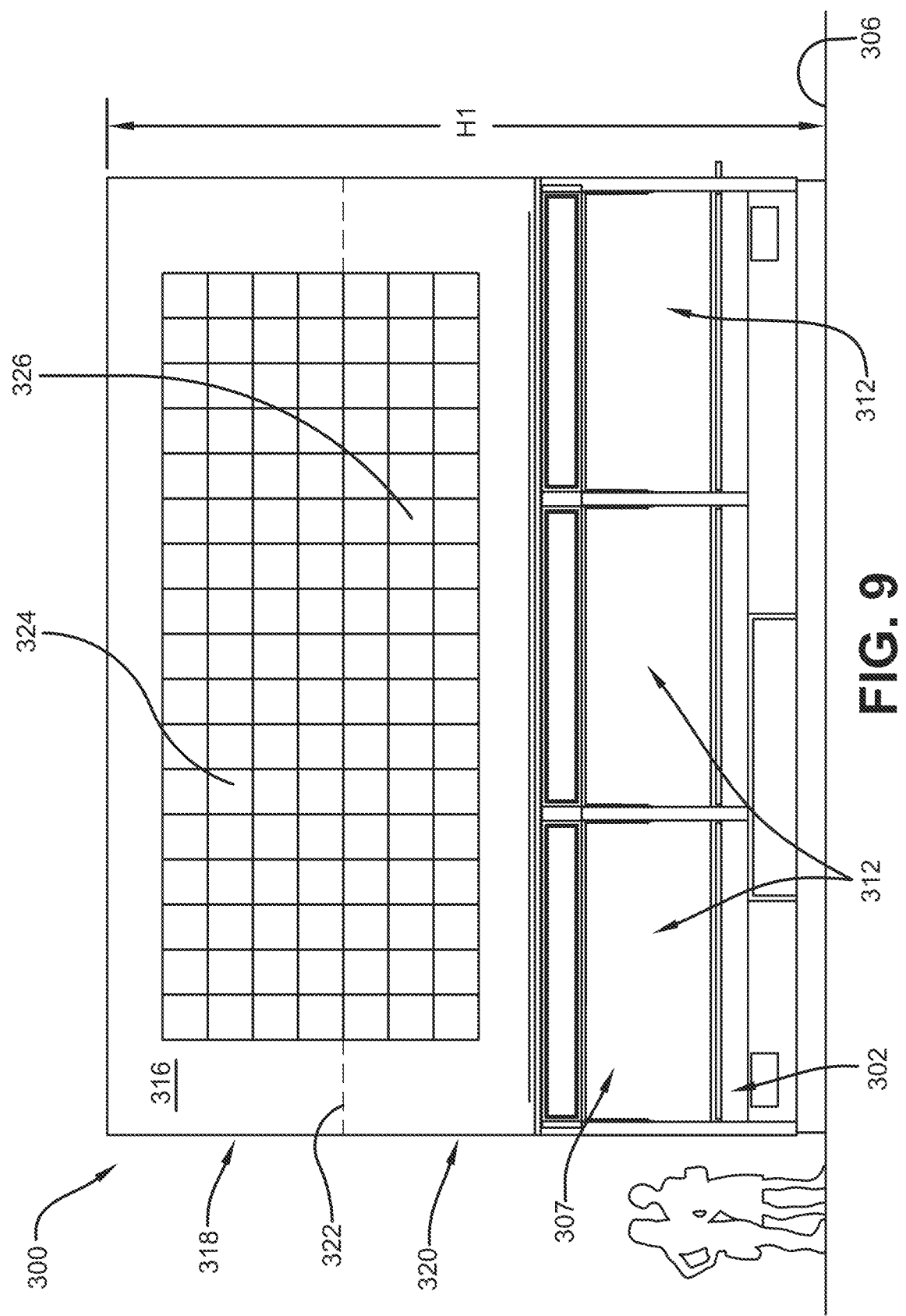
FIG. 9 is a front view of the portable food concession trailer shown in FIG. 3 but in the first position.
Figure 10:
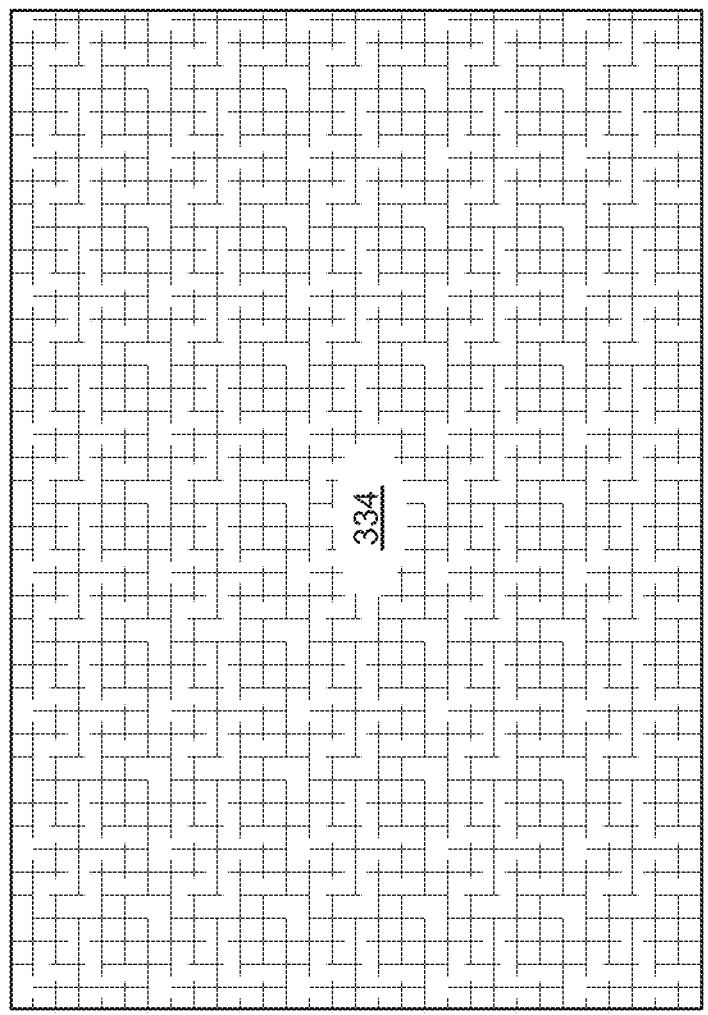
FIG. 10 is a first side view of an LED panel according to some embodiments of this invention.
Figure 15:
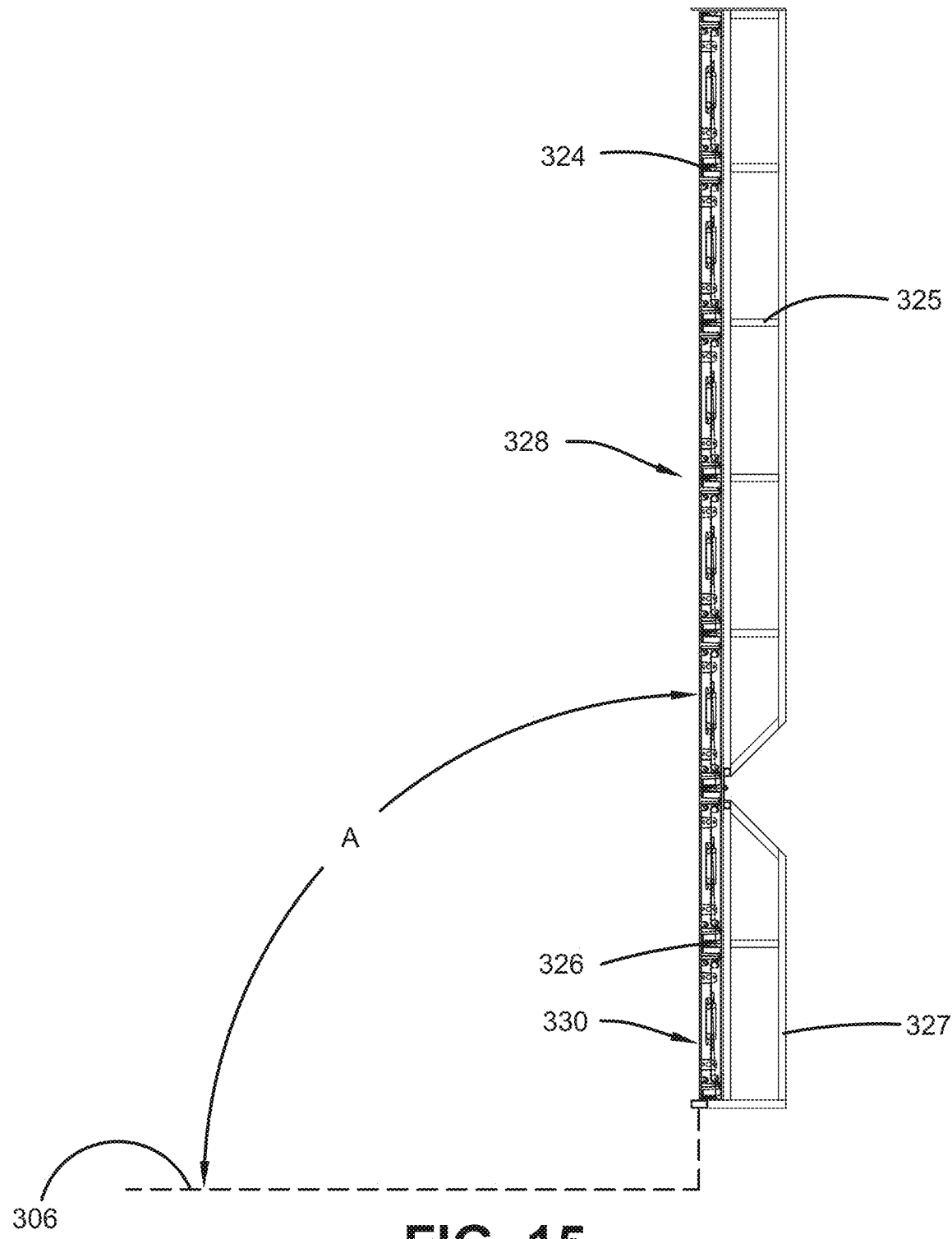
FIG. 15 is a side view of the first and second LED screens in the first position.

Options and preferences for when the first and second LED display screens 324, 326 are in the first position will now be described. With reference to FIG. 15, the first LED display screen 324 may be coplanar with the second LED display screen 326 and the first and second LED display screens 324, 326 may be at an angle A with respect to the associated ground surface 306. In some embodiments, angle A is one of an acute angle of at least 45 degrees and a right angle (90 degrees). For the embodiments shown, angle A is a right angle. With reference to FIG. 12, an outer edge of the first LED display screen 324 may be separated from an outer edge of the second LED display screen 326 by a gap 344 that is no more than distance D1 (distance D1 can be any disclosed above). With reference to FIGS. 11b and 13, the lighting control system 340 may be selectively operable to create a single continuous image simultaneously using the first and second LED display screens 324, 326. With reference to FIGS. 9 and 13, the first LED display screen 324 may be positioned above the second LED display screen 326 and/or at least one of the first and second LED display screens 324, 326 may have a maximum height H1 above the associated ground surface 306 that is at least 13.5 feet. In some embodiments maximum height H1 is about 23.5 feet.

Figure 4:
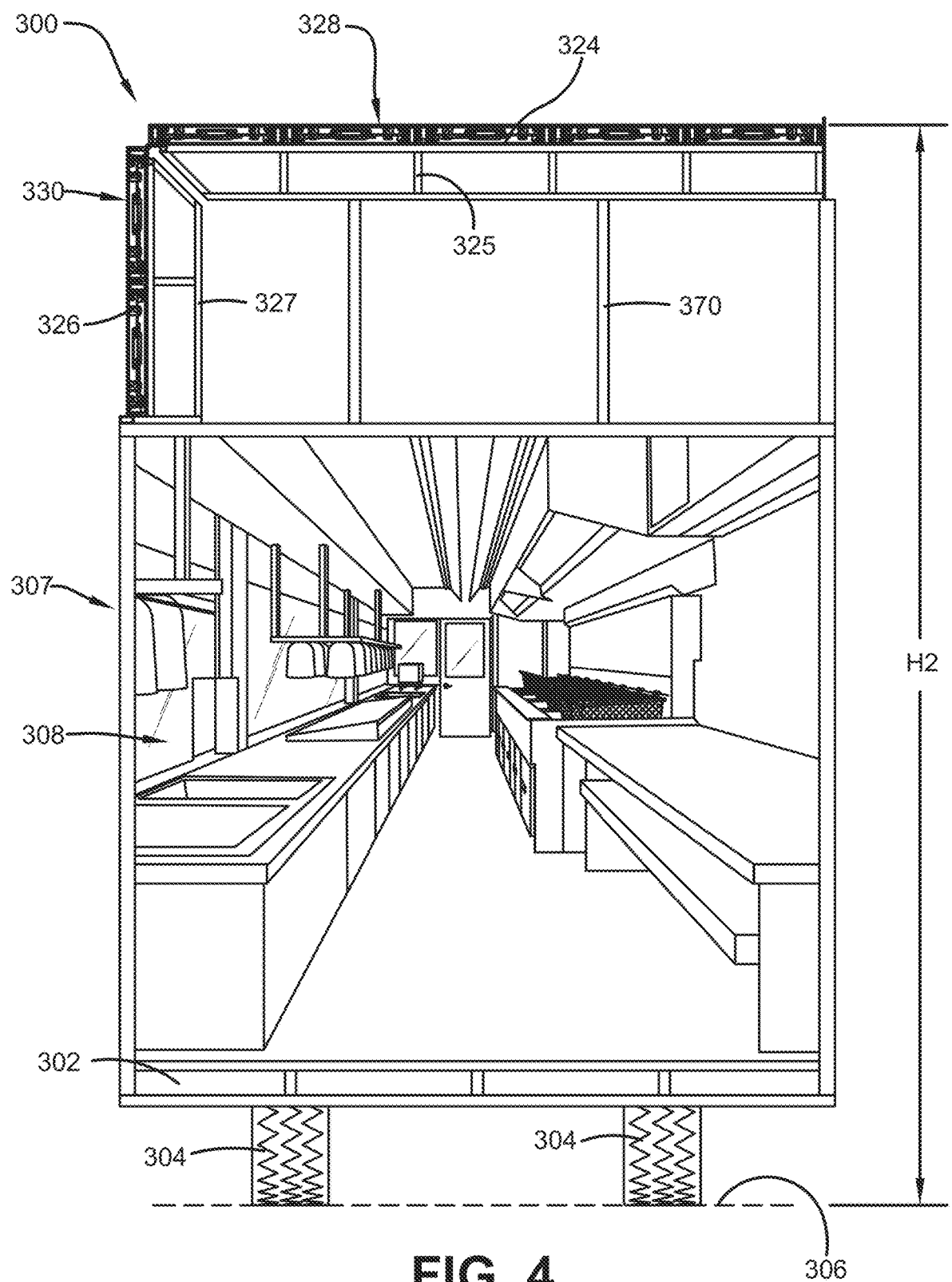
FIG. 4 is a sectional view along line 4-4 of FIG. 3.
Figure 5:
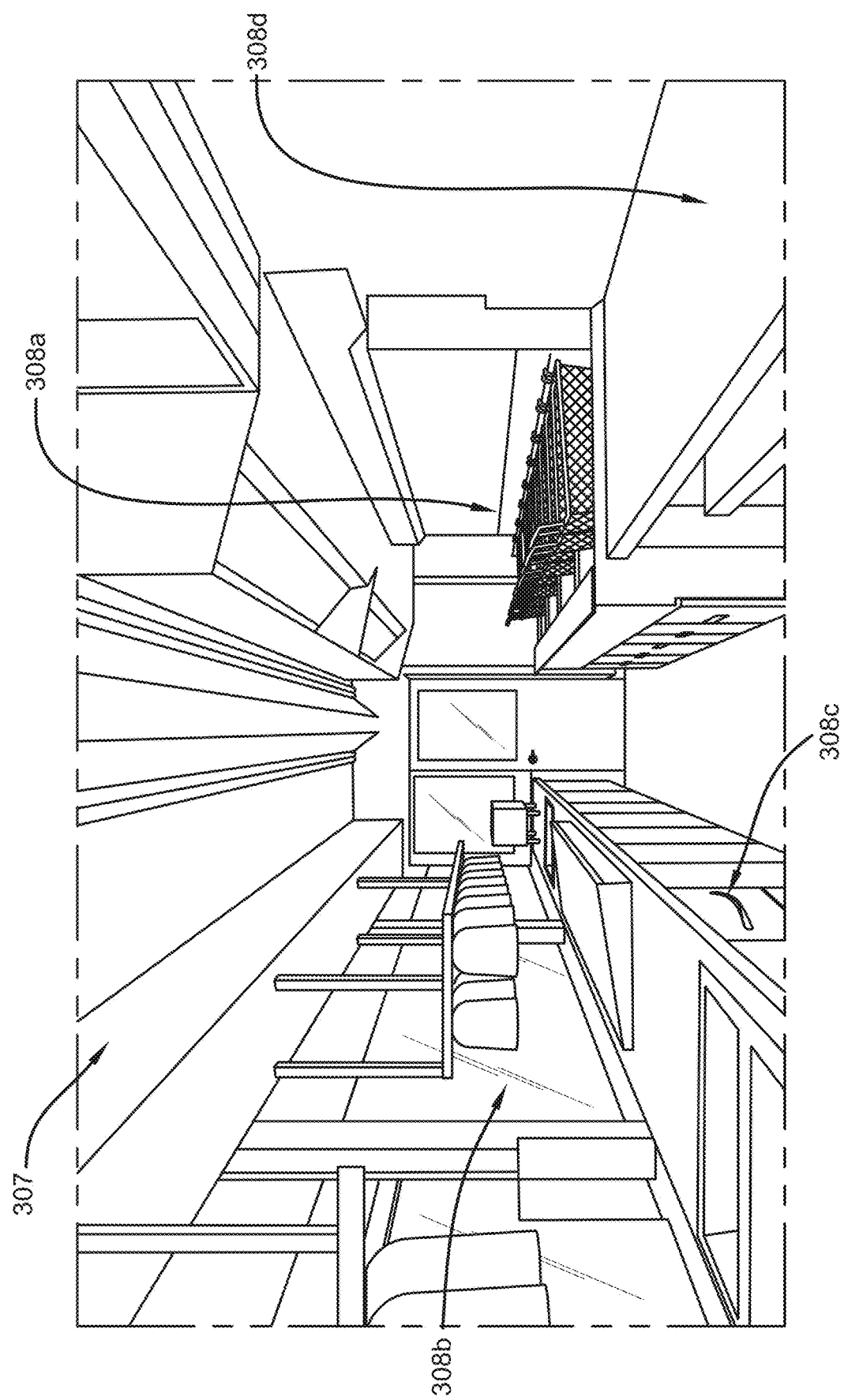
FIG. 5 is an internal end view of the food processing area of the food concession trailer shown in FIGS. 3 and 4.
Figure 6:
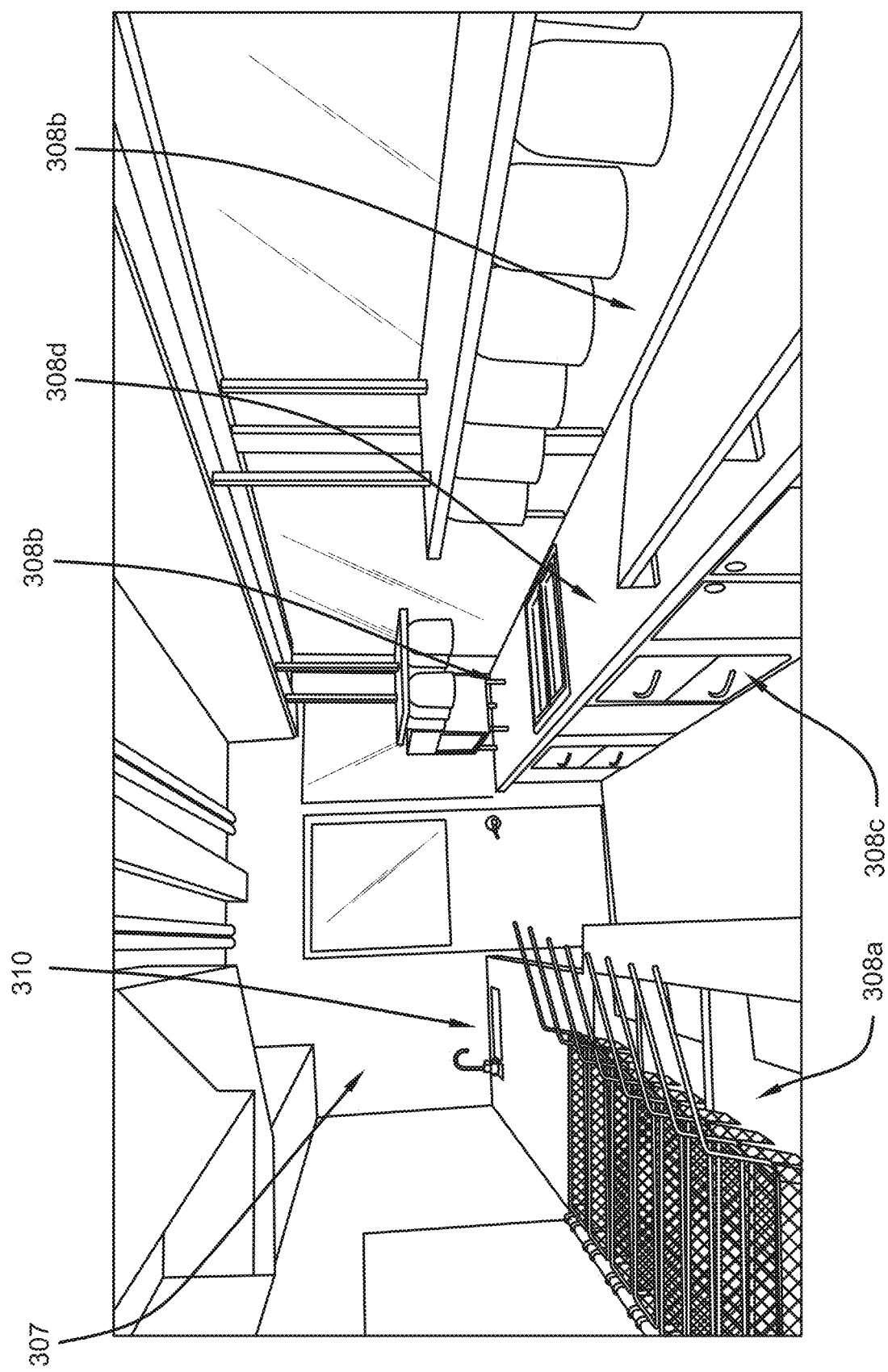
FIG. 6 is an internal perspective view of the food processing area of the food concession trailer shown in FIGS. 3 and 4.
Figure 7:
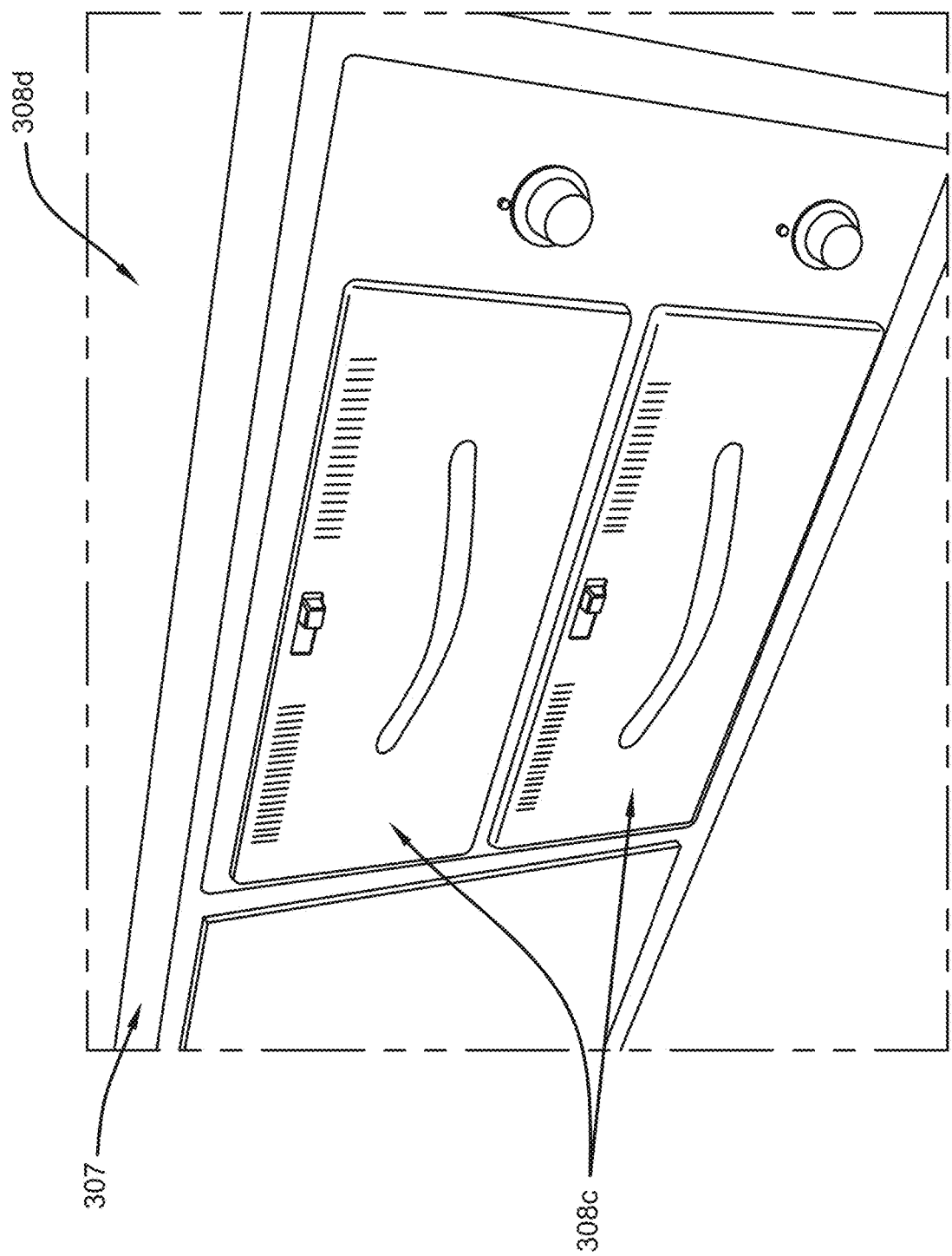
FIG. 7 is perspective view of two ovens within the food processing area of the food concession trailer shown in FIGS. 3 and 4.
Figure 8:
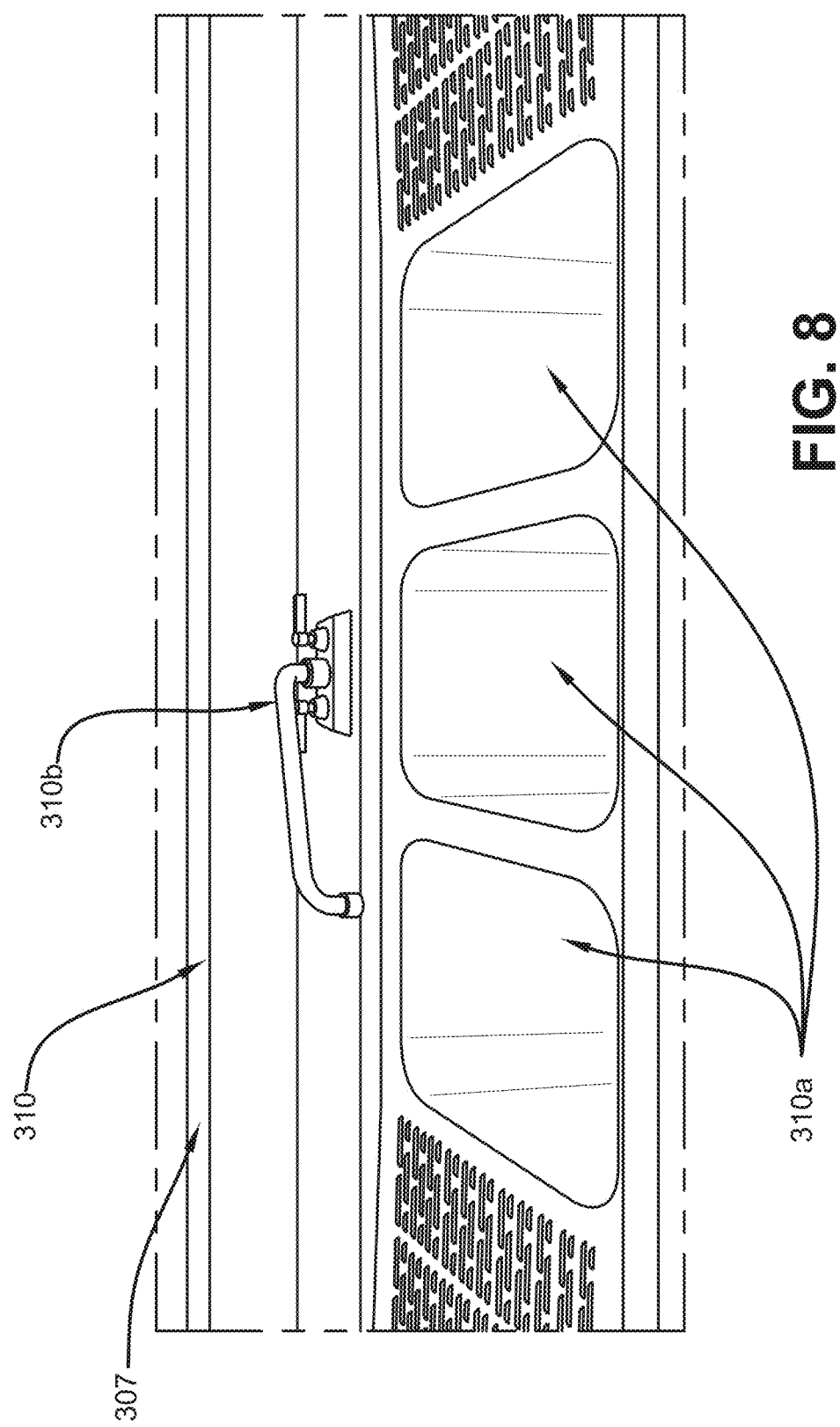
FIG. 8 is perspective view of a sink within the food processing area of the food concession trailer shown in FIGS. 3 and 4.
Figure 17:
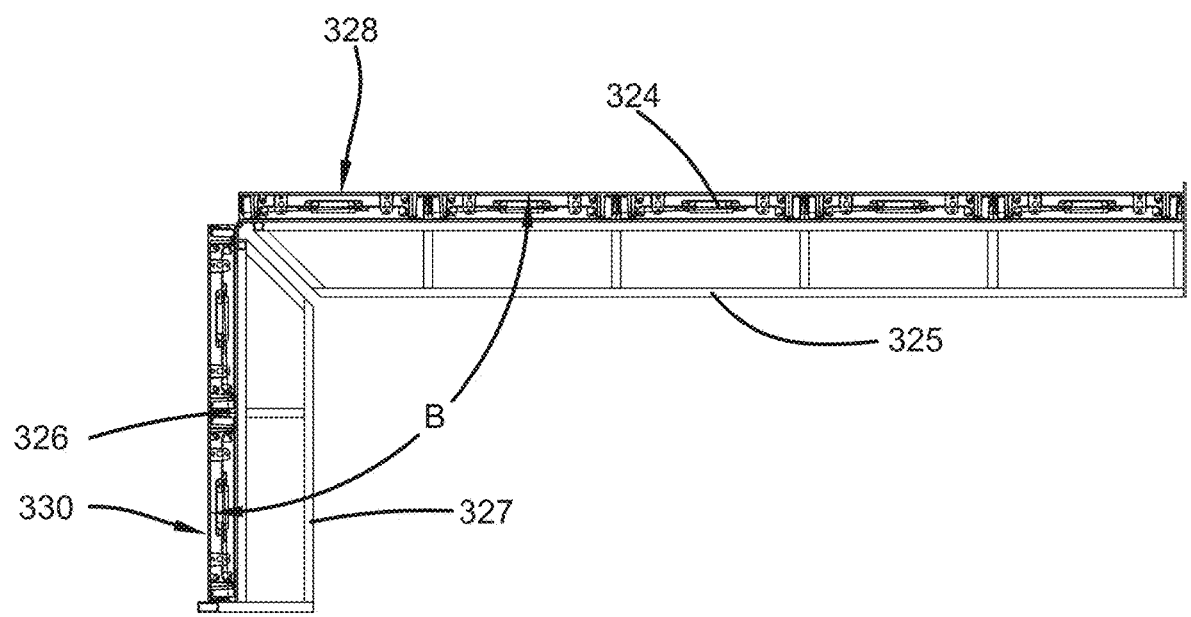
FIG. 17 is a side view of the first and second LED screens in the second position.

Options and preferences for when the first and second LED display screens 324, 326 are in the second position will now be described. With reference to FIG. 17, the first LED display screen 324 may be at an angle B with respect to the second LED display screen 326. In some embodiments, angle B may be between 0 degrees and 75 degrees. For the embodiments shown, angle B is 45 degrees. With reference to FIGS. 3 and 18, in some embodiments the screen frame 325, and thus the first LED display screen 324, may rest on the support structure 370. With reference to FIGS. 3 and 4, both the first and second LED display screens 324, 326 may have a maximum height H2 above the associated ground surface 306 that is less than 13.5 feet so that the portable food concession trailer can pass under bridges on public roads.

Figure 16:
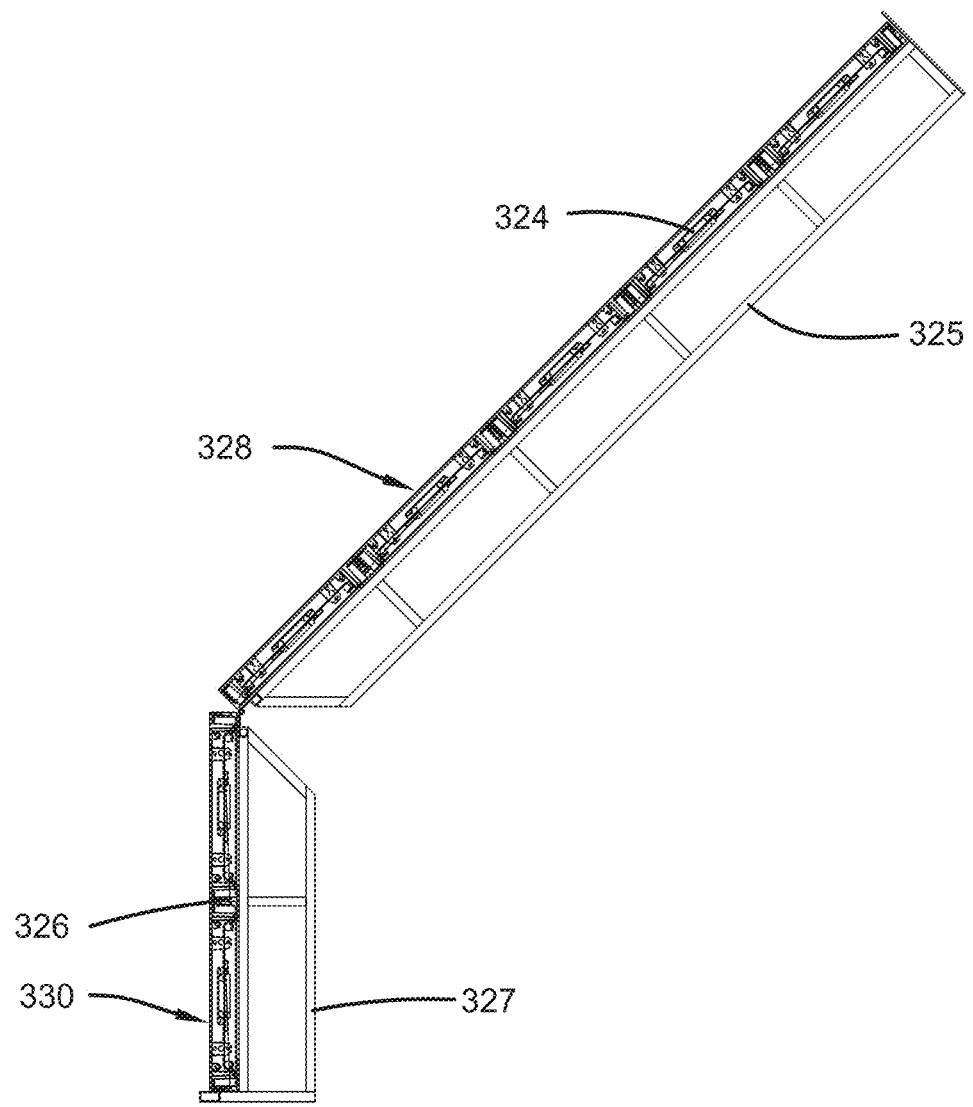
FIG. 16 is a side view of the first and second LED screens in a position that is between the first and the second positions.

Overall operation of the LED display screens 324, 326 will now be described. With the first and second LED display screens 324, 326 in the second position, FIGS. 3 and 4, the food concession trailer 300 can be transported on public roads without concern of passing under bridges, FIG. 1, because the maximum height H2 is less than 13.5 feet. Once the food concession trailer 300 is in the desired position for use onsite, the operator may operate the adjustment mechanism 350, FIG. 14, such as by moving the control lever 366 of the adjustment system controller 354. This action may cause the piston rod(s) 358 to extend causing the first LED display screen 324 to pivot with respect to the second LED display screen 326 from the position shown in FIG. 17, to the position shown in FIG. 16 and then to the position shown in FIG. 15—the first position. The operator may then operate the lighting control system 340, FIG. 11B, causing the first and second LED display screens 324, 326 to create a continuous image simultaneously, FIG. 13. This continuous image can extend far above the 13.5 feet limitation required for public transport. In some embodiments, the portable food concession trailer 300 is designed for outdoor use. When it is time to move to the next event or other destination, the operator may operate the lighting control system 340, FIG. 11B, turning the first and second LED display screens 324, 326 off. The operator may then operate the adjustment mechanism 350, FIG. 14, such as by moving the control lever 366 of the adjustment system controller 354. This action may cause the piston rod(s) 358 to retract causing the first LED display screen 324 to pivot with respect to the second LED display screen 326 from the position shown in FIG. 15, to the position shown in FIG. 16 and then to the position shown in FIG. 17 as well as FIGS. 3-4—the second position. The portable food concession trailer 300 can now be safely transported to the next event or other destination.

Figure 20:
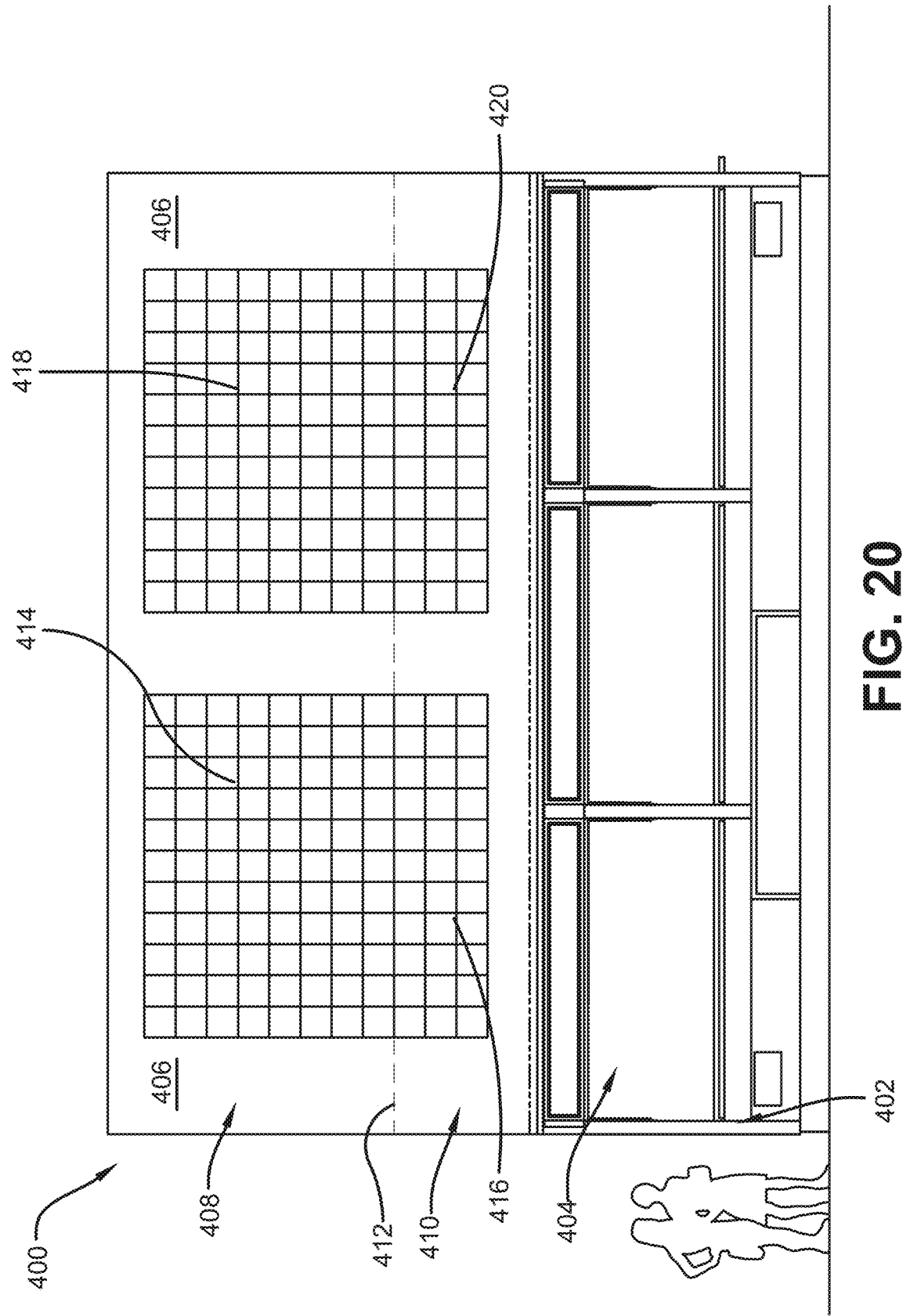
FIG. 20 is a front view of a portable food concession trailer showing other embodiments.

With reference now to FIG. 20, portable food concession trailer 400 provides additional embodiments of this invention though it may include components like those described above. Portable food concession trailer 400 may have a frame 402 and a food processing area 404 like the food processing areas described above. The food concession trailer 400 may have an advertising surface 406 with an upper portion 408 and a lower portion 410, separated by a division line 412. The upper portion 408 may be movable relative to the lower portion 410 to reduce the maximum height of the advertising surface 406 for travel in any manner chosen with sound engineering judgement such as the embodiments described above. Unlike the embodiments described above, the advertising surface 406 may have first, second, third and fourth LED display screens 414, 416, 418 and 420 respectively. The first and third LED display screens 414, 418 may be attached to the upper portion 408 and the second and fourth LED display screens 416, 420 may be attached to the lower portion 410. Each LED display screen may be supported to a corresponding screen frame, as described above. Each LED display screen may have a planar display surface with a surface area of at least 9 square feet.

With continuing reference to FIG. 20, a lighting control system, which may be similar to the lighting control systems described above, may be used to provide the desired displays on the LED display screens. In one specific embodiment, the first and second LED display screens 414, 416 may be used to provide a first continuous image and the third and fourth LED display screens 418, 420 may be used to provide a second continuous image. The first and second continuous images could be the same or they could be distinct images. An adjustment mechanism, which may be similar to the adjustment mechanisms described above, may be used to cause the first and third LED display screens 414, 418 to simultaneously pivot with respect to the second and fourth LED display screens 416, 420 from the position shown in FIG. 20 to a position similar to that shown in FIGS. 3-4.

Figure 21:
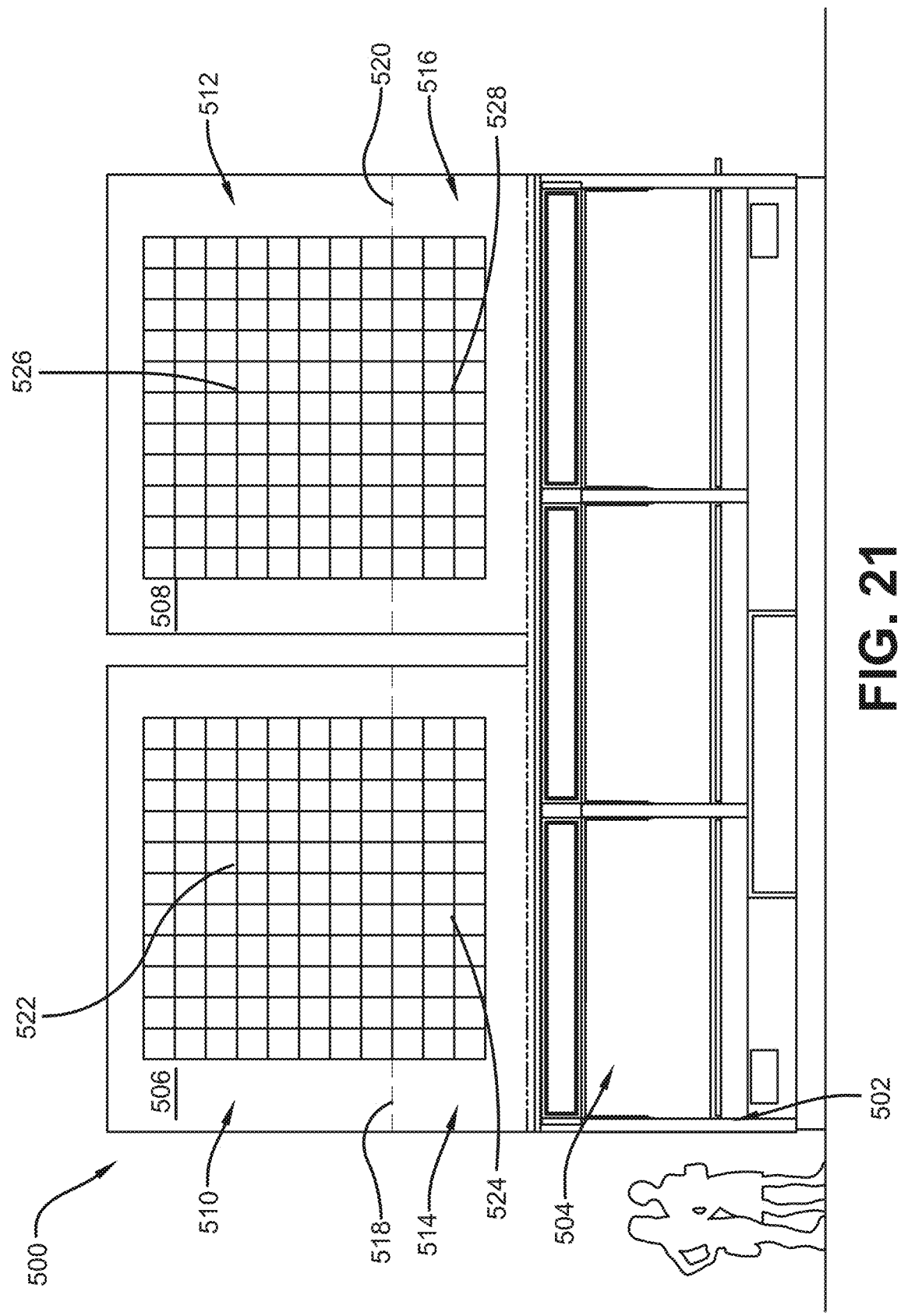
FIG. 21 is a front view of a portable food concession trailer showing other embodiments.

With reference now to FIG. 21, portable food concession trailer 500 provides additional embodiments of this invention though it may include components like those described above. Portable food concession trailer 500 may have a frame 502 and a food processing area 504 like the food processing areas described above. Unlike previous embodiments, the food concession trailer 500 may have two distinct advertising surfaces 506, 508. Each advertising surfaces 506, 508 may have an upper portion 510, 512 and a lower portion 514, 516 separated by a division line 518, 520, as shown. Each upper portion 510, 512 may be movable relative to the corresponding lower portion 514, 516 to reduce the maximum height of the advertising surfaces 506, 508 for travel in any manner chosen with sound engineering judgement such as the embodiments described above. First and second LED display screens 522, 524 may be attached to the upper and lower portions 510, 514 of advertising surface 506 and third and fourth LED display screens 526, 528 may be attached to the upper and lower portions 512, 516 of advertising surface 508. Each LED display screen may be supported to a corresponding screen frame, as described above, and each LED display screen may have a planar display surface with a surface area of at least 9 square feet.

With continuing reference to FIG. 21, a lighting control system, which may be similar to the lighting control systems described above, may be used to provide the desired displays on the LED display screens. In one specific embodiment, the first and second LED display screens 522, 524 may be used to provide a first continuous image and the third and fourth LED display screens 526, 528 may be used to provide a second continuous image. The first and second continuous images could be the same or they could be distinct images. Two adjustment mechanisms, which may be similar to the adjustment mechanisms described above, may be used respectively to cause the first and third LED display screens 522, 526 to pivot with respect to the second and fourth LED display screens 524, 528 from the position shown in FIG. 21 to a position similar to that shown in FIGS. 3-4. Note that this adjustment could be done simultaneously or the first and second LED display screens 522, 524 could be adjusted independently of the third and fourth LED display screens 526, 528— providing more options for the operator.

Numerous embodiments have been described herein. It will be apparent to those skilled in the art that the above methods and apparatuses may incorporate changes and modifications without departing from the general scope of this invention. It is intended to include all such modifications and alterations in so far as they come within the scope of the patent claims or the equivalents thereof. Further, the "invention" as that term is used in this document is what is claimed in the patent claims. The right to claim elements and/or sub-combinations that are disclosed herein as other inventions in other patent documents is hereby unconditionally reserved.

Having thus described the invention, it is now claimed:

1. A portable food concession trailer comprising:
   a trailer frame;
   at least two ground engaging wheels rotatably mounted to the trailer frame and selectively operable to carry the portable food concession trailer along an associated ground surface;
   a food processing area supported to the trailer frame and including:
   1) at least one sink including at least one basin and at least one water supply implement; and
   2) at least two distinct food processing components;
   a first LED display screen:
   1) supported to the trailer frame; and
   2) having a planar surface area of at least 9 square feet;
   a second LED display screen:
   1) supported to the trailer frame; and
   2) having a planar surface area of at least 9 square feet;
   a lighting control system:
   1) supported to the trailer frame; and
   2) operatively connected to the first and second LED display screens; and
   an adjustment mechanism:
   1) supported to the trailer frame; and
   2) operatively connected to at least one of the first and second LED display screens;
   wherein:
   1) the adjustment mechanism is selectively operable to move the first LED display screen with respect to the second LED display screen between a first position and a second position;
   2) when in the first position:
      (a) the first LED display screen is coplanar with the second LED display screen;
      (b) the first and second LED display screens are at an angle A with respect to the associated ground surface;
      (c) angle A is one of: an acute angle of at least 45 degrees and a right angle;
      (d) an outer edge of the first LED display screen is separated from an outer edge of the second LED display screen by no more than distance D1 and D1 is 1.0 inch;
      (e) the lighting control system is selectively operable to create a single continuous image simultaneously using the first and second LED display screens; and
      (f) at least one of the first and second LED display screens has a maximum height above the associated ground surface that is at least 13.5 feet; and
   3) when in the second position:
      (a) the first LED display screen is at an angle B with respect to the second LED display screen;
      (b) angle B is between 0 degrees and 75 degrees; and
      (c) both the first and second LED display screens have a maximum height above the associated ground surface that is less than 13.5 feet so that the portable food concession trailer can pass under bridges on public roads.

2. The portable food concession trailer of claim 1 wherein when in the first position:
   the first LED display screen is positioned above the second LED display screen.

3. The portable food concession trailer of claim 1 wherein:
   the first and second LED display screens are positioned above the food processing area.

4. The portable food concession trailer of claim 1 wherein:
   the first LED display screen includes:
   1) a screen frame; and
   2) at least two distinct LED panels mounted to the screen frame; and
   the second LED display screen includes:
   1) a screen frame; and
   2) at least two distinct LED panels mounted to the screen frame.

5. The portable food concession trailer of claim 1 wherein:
   the first LED display screen includes a screen frame;
   the second LED display screen includes a screen frame;
   one or more hinges interconnect the screen frame of the first LED display screen with the screen frame of the second LED display screen; and
   the adjustment mechanism is selectively operable to pivot the first LED display screen with respect to the second LED display screen between the first position and the second position.

6. The portable food concession trailer of claim 1 wherein:
   angle A is a right angle;
   angle B is 45 degrees;
   distance D1 is 0.5 inches;
   the planar surface area of the first LED display screen is at least 20 square feet; and
   the planar surface area of the second LED display screen is at least 20 square feet.

7. The portable food concession trailer of claim 1 further comprising:
   a third LED display screen:
   1) supported to the trailer frame; and
   2) having a planar surface area of at least 9 square feet;
   a fourth LED display screen:
   1) supported to the trailer frame; and
   2) having a planar surface area of at least 9 square feet;
   wherein:
   1) the lighting control system is operatively connected to the third and fourth LED display screens;
   2) the adjustment mechanism is operatively connected to at least one of the third and fourth LED display screens;
   3) the adjustment mechanism is selectively operable to move the third LED display screen with respect to the fourth LED display screen between a first position and a second position;
   4) when the third and fourth LED display screens are in their first position:

(a) the third LED display screen is coplanar with the fourth LED display screen;
(b) the third and fourth LED display screens are at an angle C with respect to the associated ground surface;
(c) angle C is one of: an acute angle of at least 45 degrees and a right angle;
(d) an outer edge of the third LED display screen is separated from an outer edge of the fourth LED display screen by no more than distance D1;
(e) the lighting control system is selectively operable to create a single continuous image simultaneously using the third and fourth LED display screens; and
(f) at least one of the third and fourth LED display screens has a maximum height above the associated ground surface that is at least 13.5 feet; and
3) when the third and fourth LED display screens are in their second position:
(a) the third LED display screen is at an angle D with respect to the fourth LED display screen;
(b) angle D is between 0 degrees and 75 degrees; and
(c) both the third and fourth LED display screens have a maximum height above the associated ground surface that is less than 13.5 feet so that the portable food concession trailer can pass under bridges on public roads.

8. The portable food concession trailer of claim 7 wherein:
the first and third LED display screens are supported to a first screen frame;
the second and fourth LED display screens are supported to a second screen frame;
one or more hinges interconnect the first screen frame to the second screen frame; and
the adjustment mechanism is selectively operable to simultaneously:
1) pivot the first LED display screen with respect to the second LED display screen between their first and second positions; and
2) pivot the third LED display screen with respect to the fourth LED display screen between their first and second positions.

9. The portable food concession trailer of claim 7 wherein:
the first LED display screen is supported to a first screen frame;
the second LED display screen is supported to a second screen frame;
the third LED display screen is supported to a third screen frame;
the fourth LED display screen is supported to a fourth screen frame;
one or more hinges interconnect the first screen frame to the second screen frame;
one or more hinges interconnect the third screen frame to the fourth screen frame;
the adjustment mechanism comprises:
1) a first adjustment device that is selectively operable to pivot the first LED display screen with respect to the second LED display screen between their first and second positions; and
2) a second adjustment device that is selectively operable to pivot the third LED display screen with respect to the fourth LED display screen between their first and second positions.

10. A food concession vehicle comprising:
a vehicle frame;
at least two ground engaging wheels rotatably mounted to the vehicle frame and selectively operable to carry the portable food concession vehicle along an associated ground surface;
a food processing area supported to the vehicle frame and including at least one food processing component;
a first LED display screen:
1) supported to the vehicle frame; and
2) having a planar surface area of at least 9 square feet;
a second LED display screen:
1) supported to the vehicle frame; and
2) having a planar surface area of at least 9 square feet;
a lighting control system:
1) supported to the vehicle frame; and
2) operatively connected to the first and second LED display screens;
an adjustment mechanism:
1) supported to the vehicle frame; and
2) operatively connected to at least one of the first and second LED display screens;
wherein:
1) the adjustment mechanism is selectively operable to move the first LED display screen with respect to the second LED display screen between a first position and a second position;
2) when in the first position:
(a) the first LED display screen is coplanar with the second LED display screen;
(b) the first and second LED display screens are at an angle A with respect to the associated ground surface;
(c) angle A is one of: an acute angle of at least 45 degrees and a right angle;
(d) an outer edge of the first LED display screen is separated from an outer edge of the second LED display screen by no more than distance D1 and D1 is 1.0 inch;
(e) the lighting control system is selectively operable to create a single continuous image simultaneously using the first and second LED display screens; and
(f) at least one of the first and second LED display screens has a maximum height above the associated ground surface that is at least 13.5 feet; and
3) when in the second position:
(a) the first LED display screen is at an angle B with respect to the second LED display screen;
(b) angle B is between 0 degrees and 75 degrees; and
(c) both the first and second LED display screens have a maximum height above the associated ground surface that is less than 13.5 feet so that the food concession vehicle can pass under bridges on public roads.

11. The food concession vehicle of claim 10 wherein:
the first and second LED display screens are positioned above the food processing area; and
when in the first position, the first LED display screen is positioned above the second LED display screen.

12. The food concession vehicle of claim 11 wherein:
the first LED display screen includes a screen frame;
the second LED display screen includes a screen frame;
one or more hinges interconnect the screen frame of the first LED display screen with the screen frame of the second LED display screen; and the adjustment mechanism is selectively operable to pivot the first LED display screen with respect to the second LED display screen between the first position and the second position.

13. The food concession vehicle of claim 12 wherein:
support structure is supported to the trailer frame;
the screen frame of the second display screen is supported to the support structure; and
when in the second position, the screen frame of the first LED display screen rests on the support structure.

14. The food concession vehicle of claim 13 wherein:
distance D1 is 0.5 inches;
the planar surface area of the first LED display screen is at least 20 square feet; and
the planar surface area of the second LED display screen is at least 20 square feet.

15. The food concession vehicle of claim 14 wherein:
the vehicle frame is a trailer frame;
angle A is a right angle; and
angle B is 45 degrees.

16. A portable food concession trailer method comprising the steps of:
A) providing a portable food concession trailer including:
  1) a trailer frame;
  2) at least two ground engaging wheels rotatably mounted to the trailer frame;
  3) a food processing area supported to the trailer frame and including:
    (a) at least one sink including a basin and a water supply implement; and
    (b) at least two distinct food processing components;
  4) a first LED display screen:
    (a) supported to the trailer frame; and
    (b) having a planar surface area of at least 9 square feet;
  5) a second LED display screen:
    (a) supported to the trailer frame; and
    (b) having a planar surface area of at least 9 square feet;
  6) a lighting control system:
    (a) supported to the trailer frame; and
    (b) operatively connected to the first and second LED display screens;
  7) an adjustment mechanism:
    (a) supported to the trailer frame; and
    (b) operatively connected to at least one of the first and second LED display screens;
B) providing the at least two ground engaging wheels to be selectively operable to carry the portable food concession trailer along an associated ground surface;
C) providing the adjustment mechanism to be selectively operable to move the first LED display screen with respect to the second LED display screen between a first position and a second position;
D) providing when in the first position:
  1) the first LED display screen is coplanar with the second LED display screen;
  2) the first and second LED display screens are at an angle A with respect to the associated ground surface;
  3) angle A is one of: an acute angle of at least 45 degrees and a right angle;
  4) an outer edge of the first LED display screen is separated from an outer edge of the second LED display screen by no more than distance D1 and D1 is 1.0 inch;
  5) the lighting control system is selectively operable to create a single continuous image simultaneously using the first and second LED display screens; and
  6) at least one of the first and second LED display screens has a maximum height above the associated ground surface that is at least 13.5 feet; and
E) providing when in the second position:
  1) the first LED display screen is at an angle B with respect to the second LED display screen;
  2) angle B is between 0 degrees and 75 degrees; and
  3) both the first and second LED display screens have a maximum height above the associated ground surface that is less than 13.5 feet so that the portable food concession vehicle can pass under bridges on public roads.

17. The portable food concession trailer method of claim 16 wherein step A) comprises the steps of:
providing the first LED display screen to include:
  1) a screen frame; and
  2) at least two distinct LED panels mounted to the screen frame; and
providing the second LED display screen to include:
  1) a screen frame; and
  2) at least two distinct LED panels mounted to the screen frame.

18. The portable food concession trailer method of claim 16 wherein:
step A) comprises the step of: providing one or more hinges that interconnect the first LED display screen with the second LED display screen; and
step C) comprises the step of: providing the adjustment mechanism to be selectively operable to pivot the first LED display screen with respect to the second LED display screen between the first position and the second position.

19. The portable food concession trailer method of claim 16 wherein step D) 4) comprises the step of:
providing distance D1 to be 0.5 inches;
providing the planar surface area of the first LED display screen to be at least 20 square feet; and
providing the planar surface area of the second LED display screen to be at least 20 square feet.

20. The portable food concession trailer method of claim 16 wherein:
step A) comprises the steps of:
  1) providing support structure supported to the trailer frame; and
  2) supporting the second display screen to the support structure; and
step E) comprises the step of resting the first LED display screen on the support structure.

* * * * *